(12) United States Patent
Liu et al.

(10) Patent No.: US 11,192,101 B2
(45) Date of Patent: Dec. 7, 2021

(54) METHOD TO CREATE MULTILAYER MICROFLUIDIC CHIPS USING SPIN-ON CARBON AS GAP FILLING MATERIALS

(71) Applicant: International Business Machines Corporation, Armonk, NY (US)

(72) Inventors: Chi-Chun Liu, Altamont, NY (US); Yann Mignot, Slingerlands, NY (US); Joshua T. Smith, Croton on Hudson, NY (US); Bassem M. Hamieh, Albany, NY (US); Nelson Felix, Slingerlands, NY (US); Robert L. Bruce, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 259 days.

(21) Appl. No.: 16/419,684

(22) Filed: May 22, 2019

(65) Prior Publication Data
US 2020/0070150 A1 Mar. 5, 2020

Related U.S. Application Data

(60) Provisional application No. 62/724,149, filed on Aug. 29, 2018, provisional application No. 62/723,702, filed on Aug. 28, 2018.

(51) Int. Cl.
*B01L 3/00* (2006.01)
*B81C 1/00* (2006.01)
*B81B 7/00* (2006.01)

(52) U.S. Cl.
CPC ... *B01L 3/502707* (2013.01); *B01L 3/502715* (2013.01); *B81B 7/0061* (2013.01);
(Continued)

(58) Field of Classification Search
CPC ............ B01L 3/502707; B01L 3/5027; B01L 3/502715; B01L 3/00; B81C 1/00; B81C 1/00071; B81C 1/00111; B81C 1/00119
See application file for complete search history.

(56) References Cited

U.S. PATENT DOCUMENTS 6,321,791 B1 11/2001 Chow
6,592,696 B1 7/2003 Burdon et al.
(Continued)

FOREIGN PATENT DOCUMENTS

WO WO-0042233 A1 * 7/2000 ........ B01L 3/502707
WO 2005084191 A2 9/2005

OTHER PUBLICATIONS

Jiang, B., et al., "Fine structuration of low-temperature co-fired ceramic (LTCC) microreactors", Lab on a Chip, Jan. 2013, pp. 1-100, vol. 1, No. 1.
(Continued)

*Primary Examiner* — Brian J. Sines
(74) *Attorney, Agent, or Firm* — Scully, Scott, Murphy & Presser, P.C.; Daniel P. Morris, Esq.

(57) ABSTRACT

A microfluidic chip with high volumetric flow rate is provided that includes at least two vertically stacked microfluidic channel layers, each microfluidic channel layer including an array of spaced apart pillars. Each microfluidic channel layer is interconnected by an inlet/outlet opening that extends through the microfluidic chip. The microfluidic chip is created without wafer to wafer bonding thus circumventing the cost and yield issues associated with microfluidic chips that are created by wafer bonding.

10 Claims, 18 Drawing Sheets

(52) U.S. Cl.
CPC ...... *B81C 1/00071* (2013.01); *B81C 1/00111* (2013.01); *B81C 1/00119* (2013.01); *B81C 1/00309* (2013.01); *B01L 2300/0874* (2013.01); *B81B 2201/058* (2013.01)

(56) References Cited

U.S. PATENT DOCUMENTS

| | | |
|---|---|---|
| 6,645,432 B1 | 11/2003 | Anderson et al. |
| 7,033,910 B2 | 4/2006 | Faris |
| 7,799,251 B2 | 9/2010 | Therriault et al. |
| 8,865,599 B2 | 10/2014 | Bai et al. |
| 9,102,129 B2 | 8/2015 | Krishnamurthy et al. |
| 9,636,675 B2 | 5/2017 | Astier et al. |
| 2007/0090026 A1* | 4/2007 | Han .............. B01L 3/502746 209/2 |
| 2009/0035590 A1 | 2/2009 | Sullivan et al. |
| 2016/0144405 A1 | 5/2016 | Astier et al. |
| 2016/0372326 A1 | 12/2016 | Zhong et al. |
| 2017/0045475 A1* | 2/2017 | Astier .............. G01N 33/48721 |
| 2017/0136460 A1 | 5/2017 | Smith et al. |
| 2017/0144149 A1 | 5/2017 | Smith et al. |
| 2020/0070151 A1* | 3/2020 | Liu .............. B01L 3/502761 |

OTHER PUBLICATIONS

Dominik, J., et al., "Cold Chemical Lamination—New Bonding Technique of LTCC Green Tapes", Int. J. Appl. Ceram. Technol., Jun. 18, 2013, pp. 814-820, 7 [6].

Wunsch, B. H., et al., "Nanoscale lateral displacement arrays for the separation of exosomes and colloids down to 20 nm", Nature Nanotechnology, Nov. 2016, pp. 936-942, vol. 11.

Kudo, T., et al., "Development of Spin-On-Carbon Hard Mask for Advanced Node", Proc. SPIE 9051, Mar. 27, 2014, Advances in Patterning Materials and Processes XXXI, 9 pages, San Jose, CA.

Chua, C. L., et al., "Out-of-Plane High-Q Inductors on Low-Resistance Silicon", Journal of Microelectromechanical Systems, Dec. 2003, pp. 989-995, vol. 12, No. 6.

Yun, H., et al., "Study on Planarization Performance of Spin On Hardmask", 2018 China Semiconductor Technology International Conference (CSTIC), May 31, 2018, pp. 3.

* cited by examiner

METHOD TO CREATE MULTILAYER MICROFLUIDIC CHIPS USING SPIN-ON CARBON AS GAP FILLING MATERIALS

CROSS REFERENCE TO RELATED APPLICATION

The present application claims the benefit of U.S. Provisional Patent Application No. 62/723,702 filed on Aug. 28, 2018, and U.S. Provisional Patent Application No. 62/724,149 filed on Aug. 29, 2018, the entire content and disclosure of each of the aforementioned Provisional Applications is incorporated herein by reference.

BACKGROUND

The present application relates to a microfluidic chip/device. More particularly, the present application relates to a method of creating a microfluidic chip/device that contains multilayer microfluidic channels stacked one atop the other.

Deterministic lateral displacement (DLD) pillar arrays are an efficient technology to sort, separate and enrich micrometre-scale particles, which include parasites, bacteria, blood cells and circulating tumour cells in blood. However, this technology has not been translated to the true nanoscale, where it could function on biocolloids, such as exosomes. Exosomes, a key target of 'liquid biopsies', are secreted by cells and contain nucleic acid and protein information about their originating tissue. One challenge in the study of exosome biology is to sort exosomes by size and surface markers.

Recently, manufacturable silicon processes have been employed to produce microfluidic chips/devices containing nanoscale DLD (i.e., nano-DLD) pillar arrays of uniform gap sizes ranging from 25 nm to 235 nm. In such processes, wafer bonding is typically required to seal the microfluidic chips/devices. In wafer bonding formation of microfluidic chips/devices, a potential yield lost may be exhibited from leakage due to insufficient bonding, and/or pillar damage during the bonding process. Also, such bonding processes may have a higher manufacturing cost due to the need of using an extra glass or semiconductor wafer.

In addition to the above, conventional microfluidic chips/devices have a limited volumetric flow rate. For a given chip/array size, higher flow rate can be achieved by providing taller pillars within a given pillar array. However, the height of the pillar array is limited by the patterning capability (i.e., tall pillars can collapse due to aspect ratio and etch profile control). Moreover, microfluidic chips/devices composed of multilayer microfluidic channels using the prior art bonding processes have a high cost, and yield problem as mentioned above.

There is thus a need for a method that is capable of providing microfluidic chips/devices (hereinafter just microfluidic chips) that contain multilayer microfluidic channels which avoids the drawbacks that are associated with microfluidic chips/devices that are formed by wafer bonding.

SUMMARY

A microfluidic chip having a high volumetric flow rate is provided that includes at least two vertically stacked microfluidic channel layers, each microfluidic channel layer including an array of spaced apart pillars. Each microfluidic channel layer is interconnected by an inlet/outlet opening that extends through the microfluidic chip. The microfluidic chip is created without wafer to wafer bonding thus circumventing the cost and yield issues associated with microfluidic chips that are created by wafer bonding. In the present application, spin-on carbon or another like sacrificial fill material is used for gap filling and planarization after pillar array formation.

In one aspect of the present application, a method of forming a microfluidic chip is provided. In one embodiment, the method includes forming a multilayered material stack including at least a first pillar forming material layer over a substrate. A first array of first pillars is then formed in at least the first pillar forming material layer of the multilayered material stack. Gaps present between each first pillar of the first array are then filled with a first sacrificial gap filling material. A first microfluidic channel separating material layer is formed over the first array of first pillars and the first sacrificial gap filling material. A first inlet/outlet opening and a second inlet/outlet opening are formed in the first microfluidic channel separating material layer, wherein the first and second inlet/outlet openings contact the first sacrificial gap filling material. A second sacrificial gap filling material is then formed in the first and second inlet/outlet openings and contacting the first sacrificial gap filling material. Next, a second pillar forming material layer is formed on the second sacrificial gap filling material and the first microfluidic channel separating material layer, and thereafter a second array of second pillars is then formed in the second pillar forming material layer. Gaps present between each second pillar of the second array of second pillars are then filled with a third sacrificial gap filling material. A second microfluidic channel separating material layer is formed over the second array of second pillars and the third sacrificial gap filling material. Next, a first upper inlet/outlet opening and a second upper inlet/outlet opening are formed in the second microfluidic channel separating material layer, wherein the first and second upper inlet/outlet openings contact the third sacrificial gap filling material. Next, the first sacrificial gap filling material, the second sacrificial gap filling material and the third sacrificial gap filling material are removed.

In another embodiment, the method may include forming a multilayered material stack including at least a first pillar forming material layer over a substrate. A first array of first pillars is formed in the first pillar forming material layer of the multilayered material stack. Gaps present between each first pillar of the first array are then filled with a first sacrificial gap filling material. Next, a first microfluidic channel separating material layer is formed over the first array of first pillars and the first sacrificial gap filling material, and a second pillar forming material layer is formed on the first microfluidic channel separating material layer. A first inlet/outlet opening and a second inlet/outlet opening are formed in the second pillar forming material layer and the first microfluidic channel separating material layer, wherein the first and second inlet/outlet openings contact the first sacrificial gap filling material. A second array of second pillars is then formed in the second pillar forming material layer. A second sacrificial material is then formed in the first inlet/outlet opening and the second inlet/outlet opening and between each gap that is present between the second pillars of the second array. A second microfluidic channel separating material layer is formed over the second array of second pillars and the second sacrificial gap filling material. A first upper inlet/outlet opening and a second upper inlet/outlet opening are formed in the second microfluidic channel separating material layer, wherein the first and second upper inlet/outlet openings contact the second sacrificial gap filling material. Next, the first sacrificial gap filling material and the second sacrificial gap filling material are removed.

In another aspect of the present application, a microfluidic chip is provided. In one embodiment, the microfluidic chip includes at least two vertically stacked microfluidic channel layers, wherein a layer of a microfluidic channel separating material is located between each vertically stacked microfluidic channel layer. An array of pillars is present in each vertically stacked microfluidic channel layer, wherein the array of pillars and each layer of microfluidic channel separating material are composed of an inorganic dielectric material, polycrystalline silicon or amorphous silicon. An inlet/outlet opening is present that extends through the microfluidic chip and interconnecting each microfluidic channel layer.

BRIEF DESCRIPTION THE DRAWINGS

FIG. 1 is a three-dimensional (3D) representation of a multilayered material stack of a substrate, a first pad dielectric material layer, a first inorganic dielectric material layer, a first hard mask material layer, a first optical coating stack, and a first patterned photoresist including an array of first pillar shaped patterns formed therein, that can be used in accordance with an embodiment of the present application.

Figure 6:
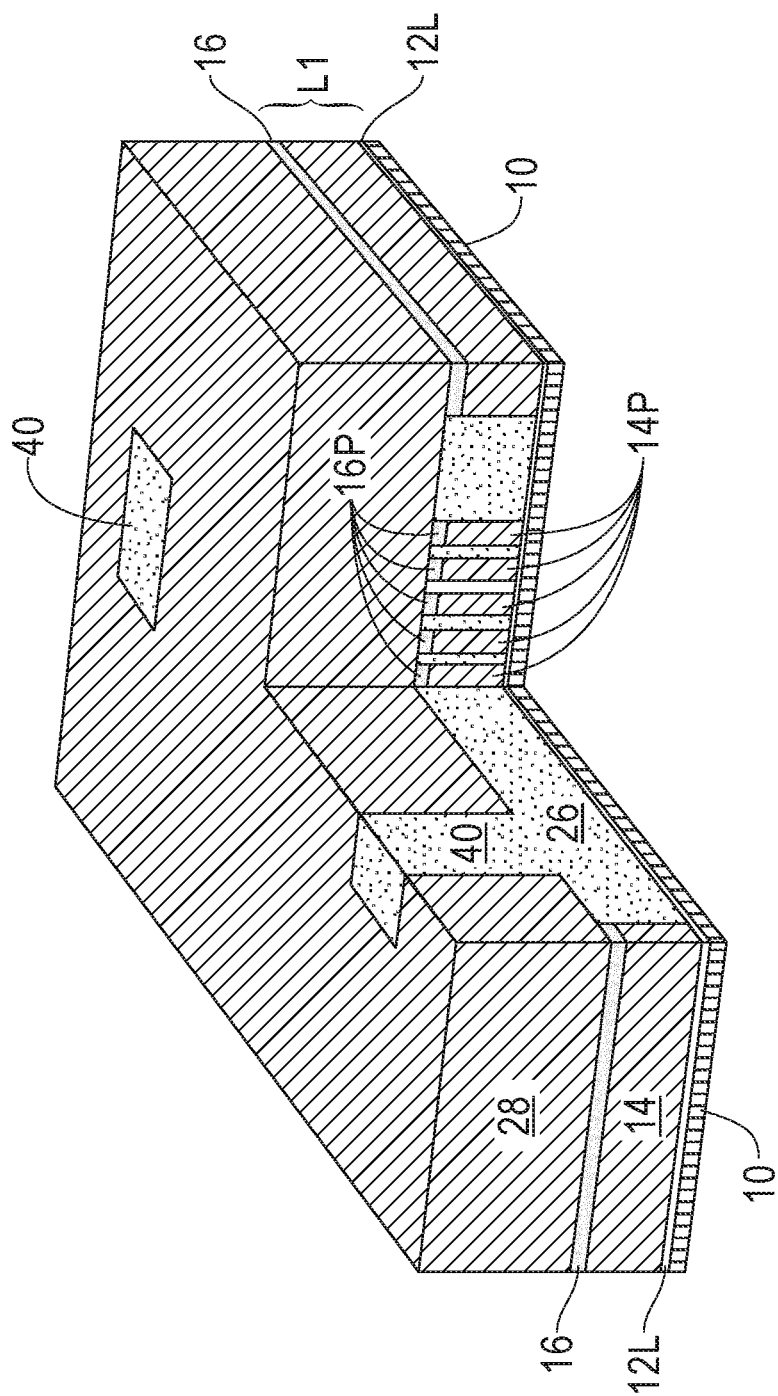
FIG. 6 is a 3D representation of the multilayered material stack of FIG. 5 after forming a second spin-on carbon fill material within the first lower level inlet/outlet opening and the second lower level inlet/outlet opening, and performing a material removal process.
Figure 7:
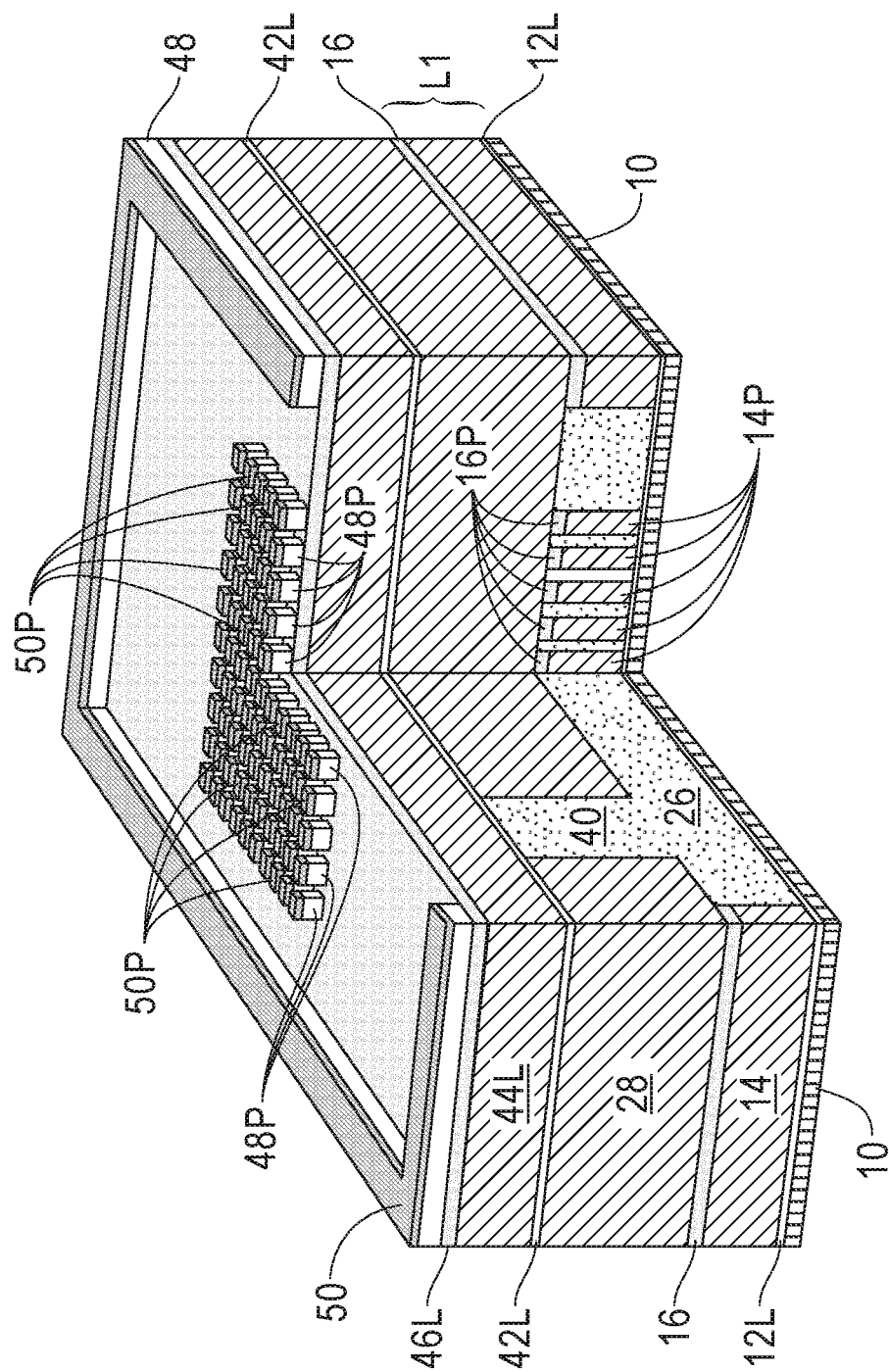

FIG. 7 is a 3D representation of the multilayered material stack of FIG. 6 after forming a second pad dielectric material layer, a third inorganic dielectric material layer, a second hard mask material layer, a third optical coating stack, a third patterned photoresist including an array of second pillar shaped patterns formed therein, and transferring the array of second pillar shaped patterns into the third optical coating stack.

Figure 8:
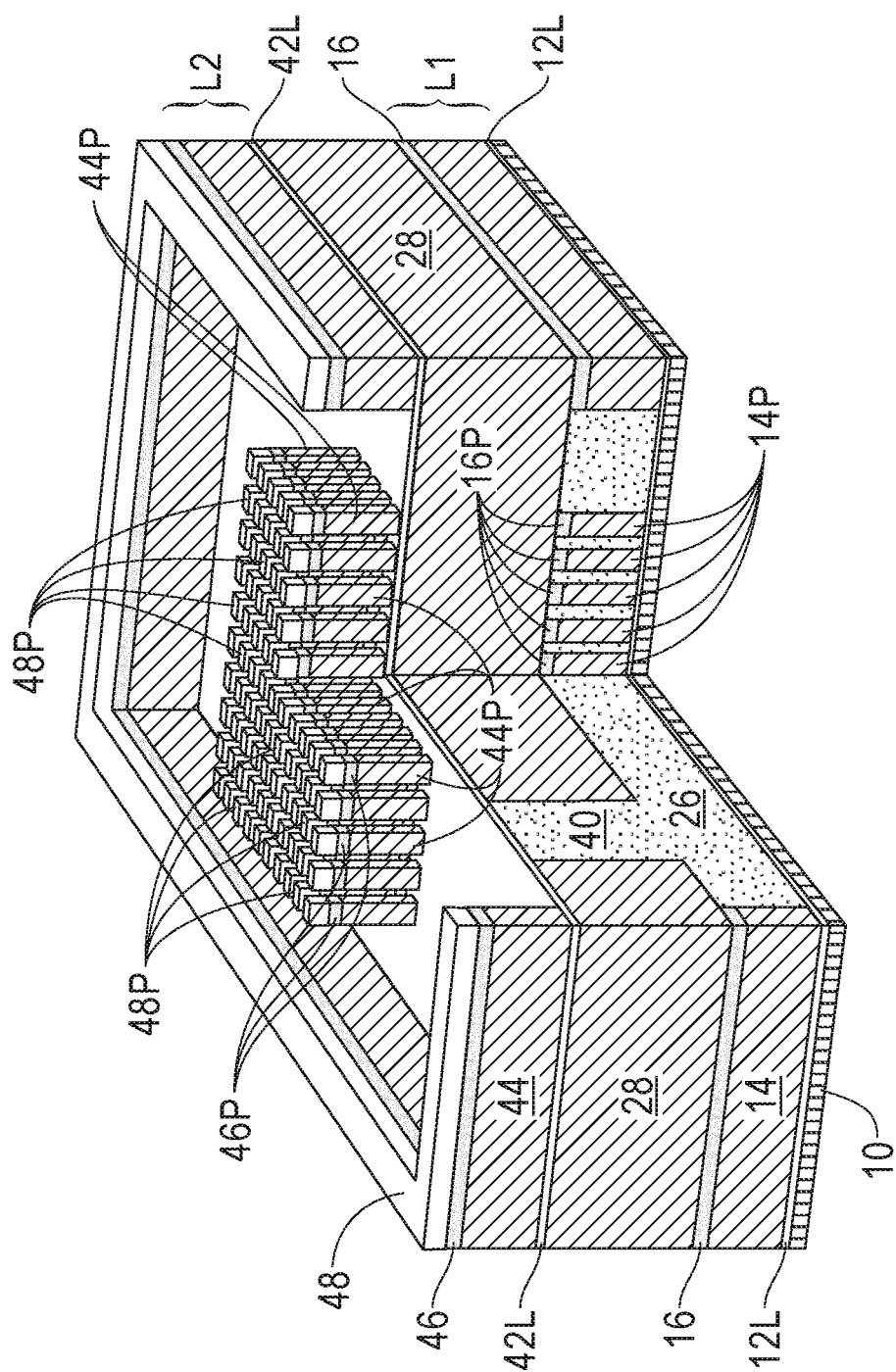

FIG. 8 is a 3D representation of the multilayered material stack of FIG. 7 after completing the transferring of the array of second pillar shaped patterns into the underlying second hard mask material layer, and the third inorganic dielectric material layer, and removing the third patterned photoresist.

Figure 9:
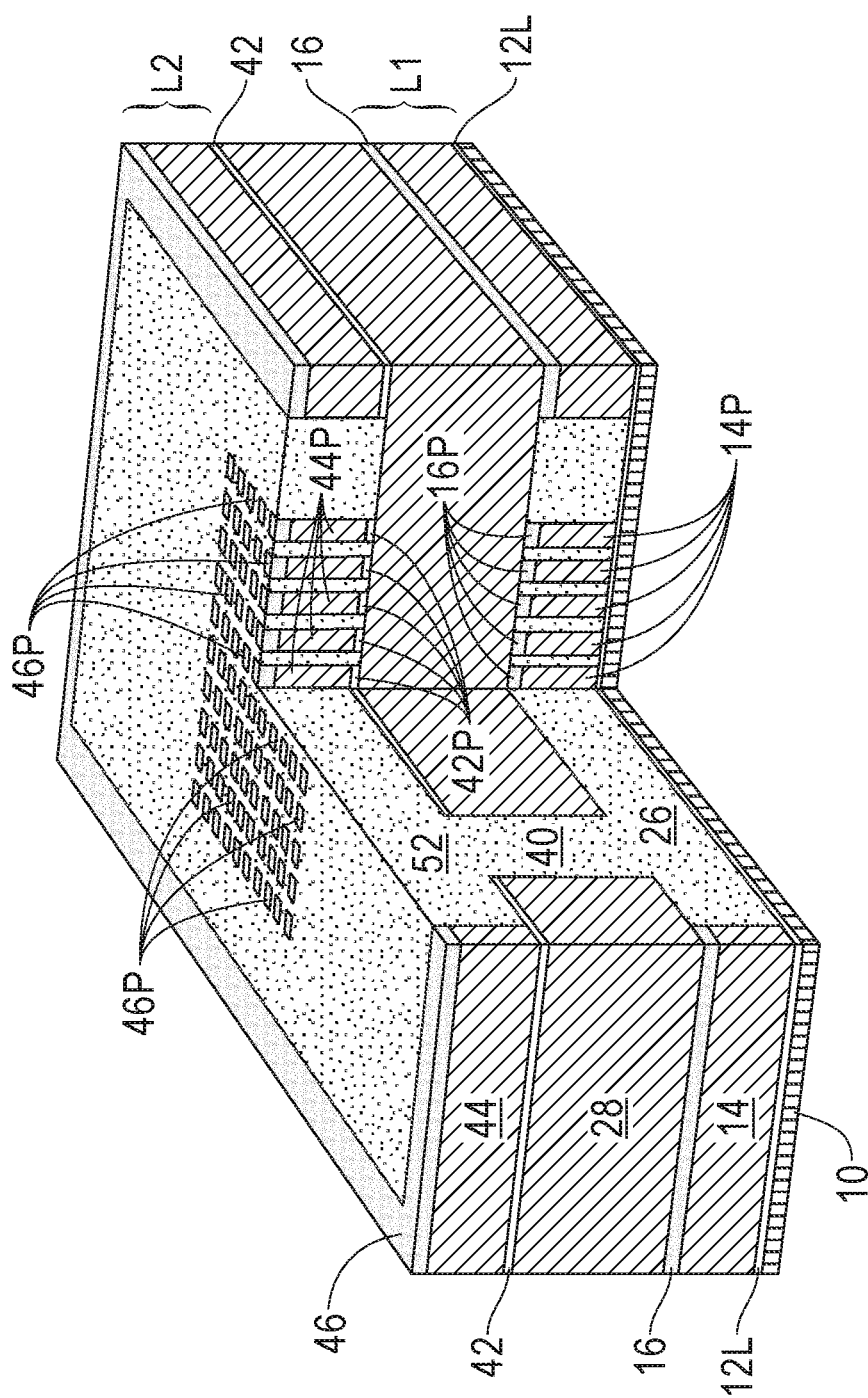

FIG. 9 is a 3D representation of the multilayered material stack of FIG. 8 after removing physically exposed portions of the second pad dielectric material, forming a third spin-on carbon fill material laterally surrounding the remaining portions of the third optical coating stack, the second hard mask material layer, the third inorganic dielectric material layer, and the second pad dielectric material layer, and performing a material removal process.

Figure 10:
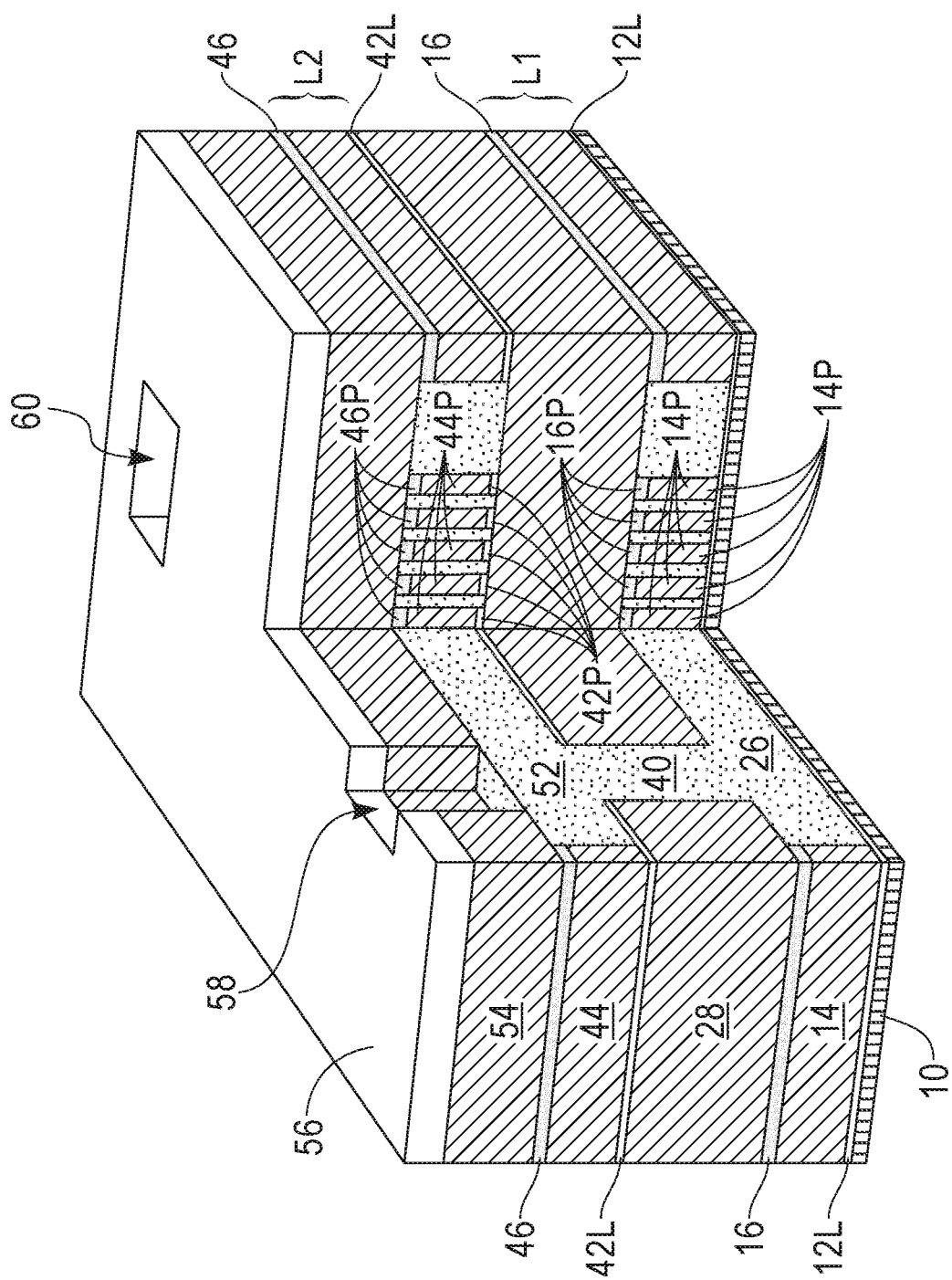

FIG. 10 is a 3D representation of the multilayered material stack of FIG. 9 after forming a fourth inorganic dielectric material layer, and a fourth optical coating stack, and forming a first upper level inlet/outlet opening and a second upper level inlet/outlet opening into the fourth optical coating stack, and the fourth inorganic dielectric material.

Figure 11:
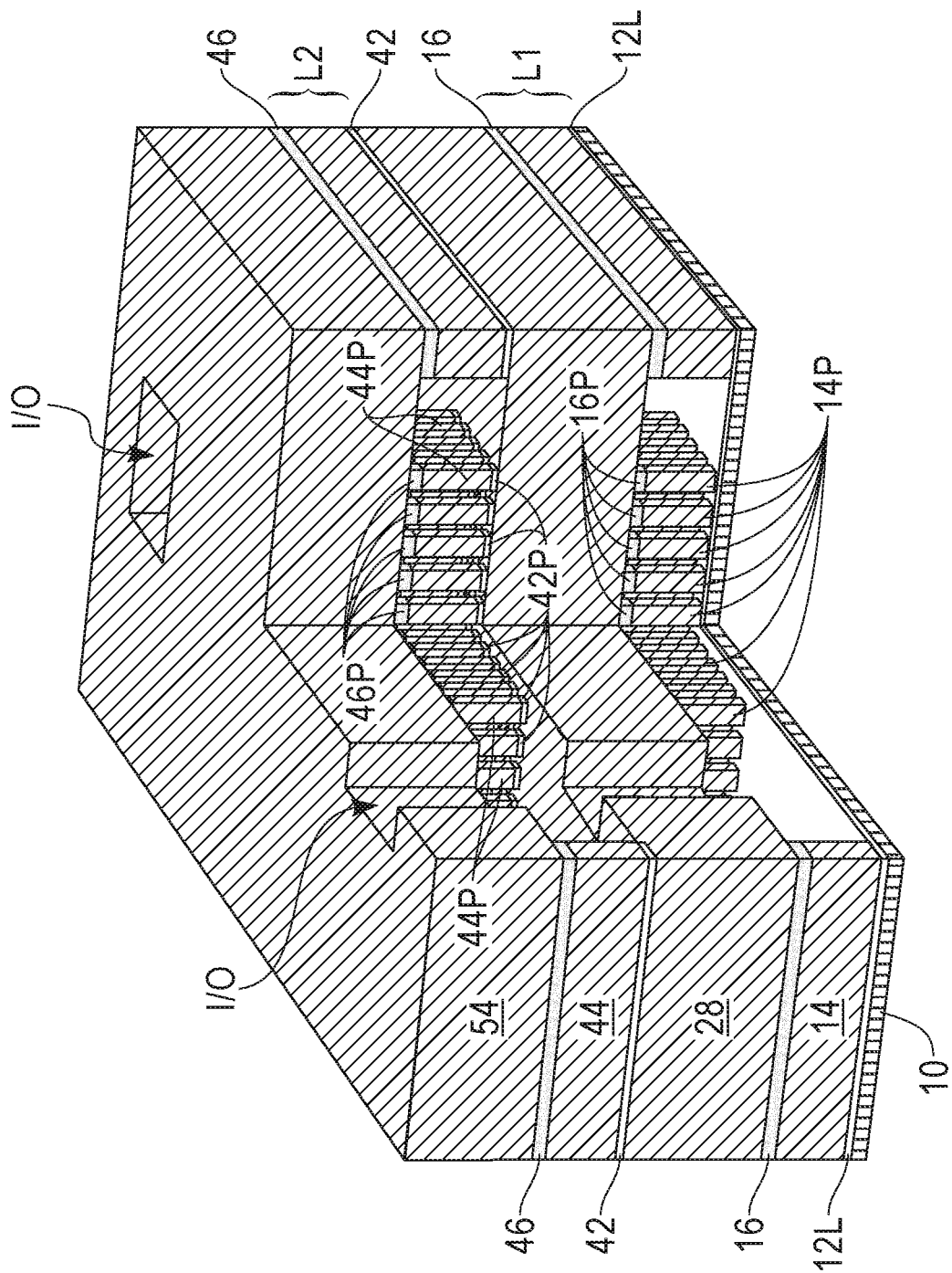

FIG. 11 is a 3D representation of the multilayered material stack of FIG. 10 after removing the third, second and first spin-on carbon fill materials to provide a microfluidic device including multilayer microfluidic channels in accordance with an embodiment of the present application.

Figure 3:
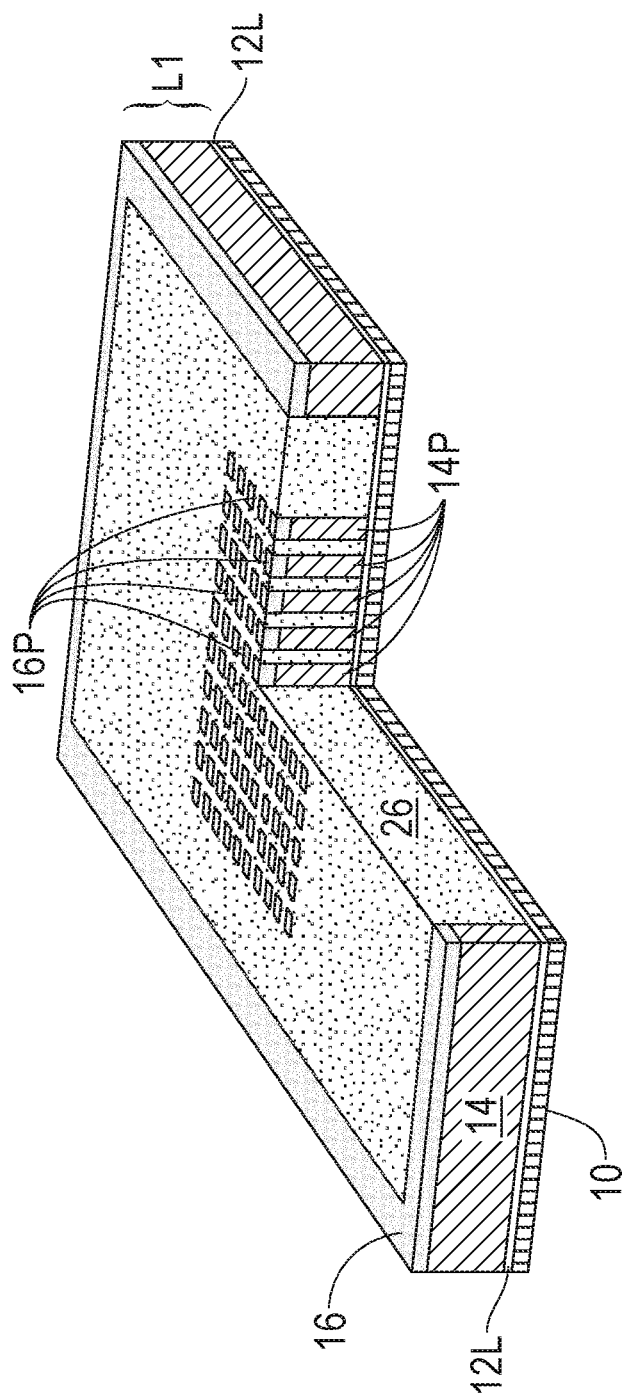
FIG. 3 is a 3D representation of the multilayered material stack of FIG. 2 after forming a first spin-on carbon fill material within wall portions of the remaining multilayered material stack, and performing a material removal process.
Figure 12:
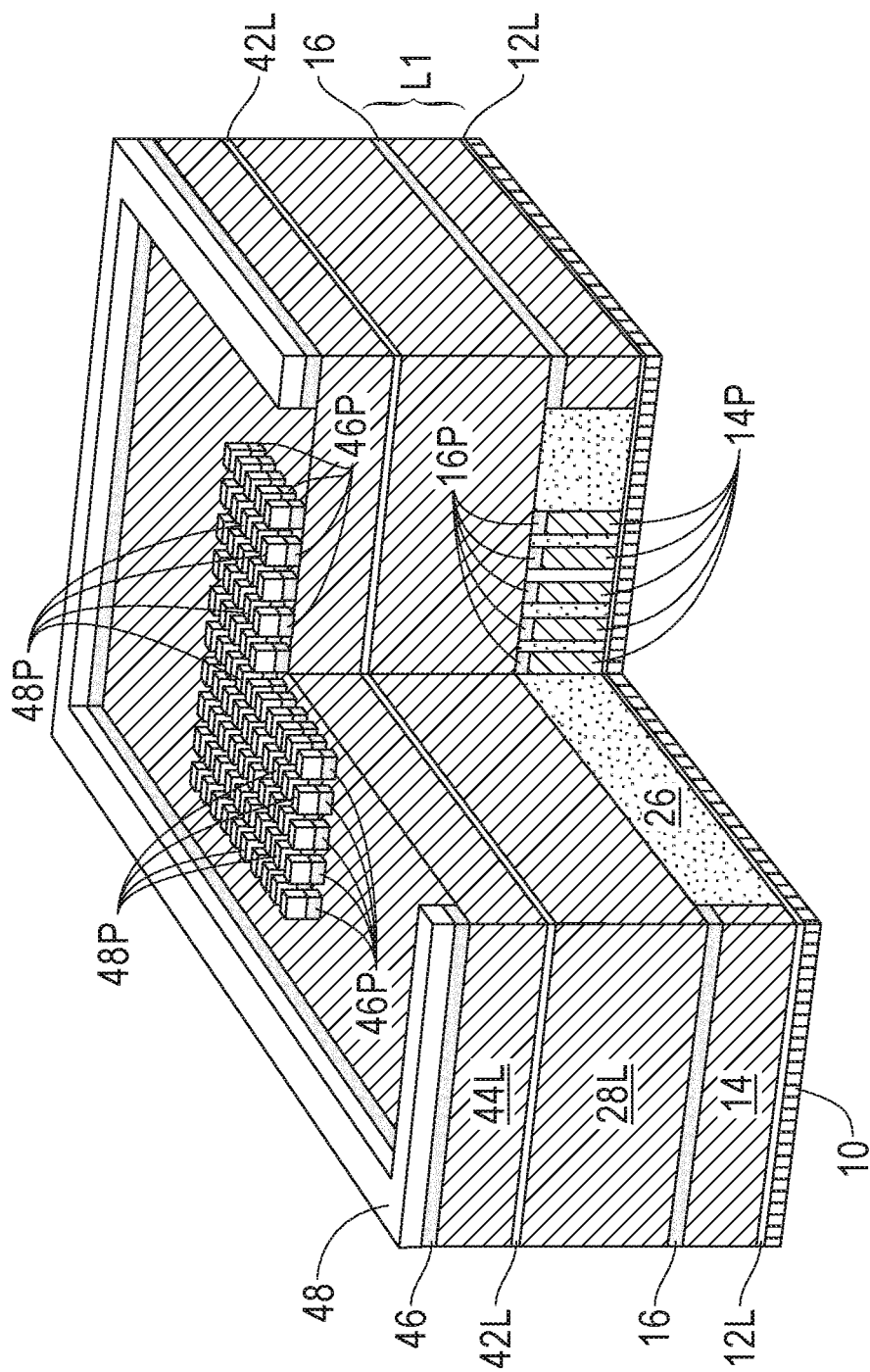

FIG. 12 is a 3D representation of the multilayered material stack of FIG. 3 after forming a second inorganic dielectric material layer, a second pad dielectric material layer, a third inorganic dielectric material layer, and an array of pillars comprising a second hard mask material and OPL material.

Figure 13:
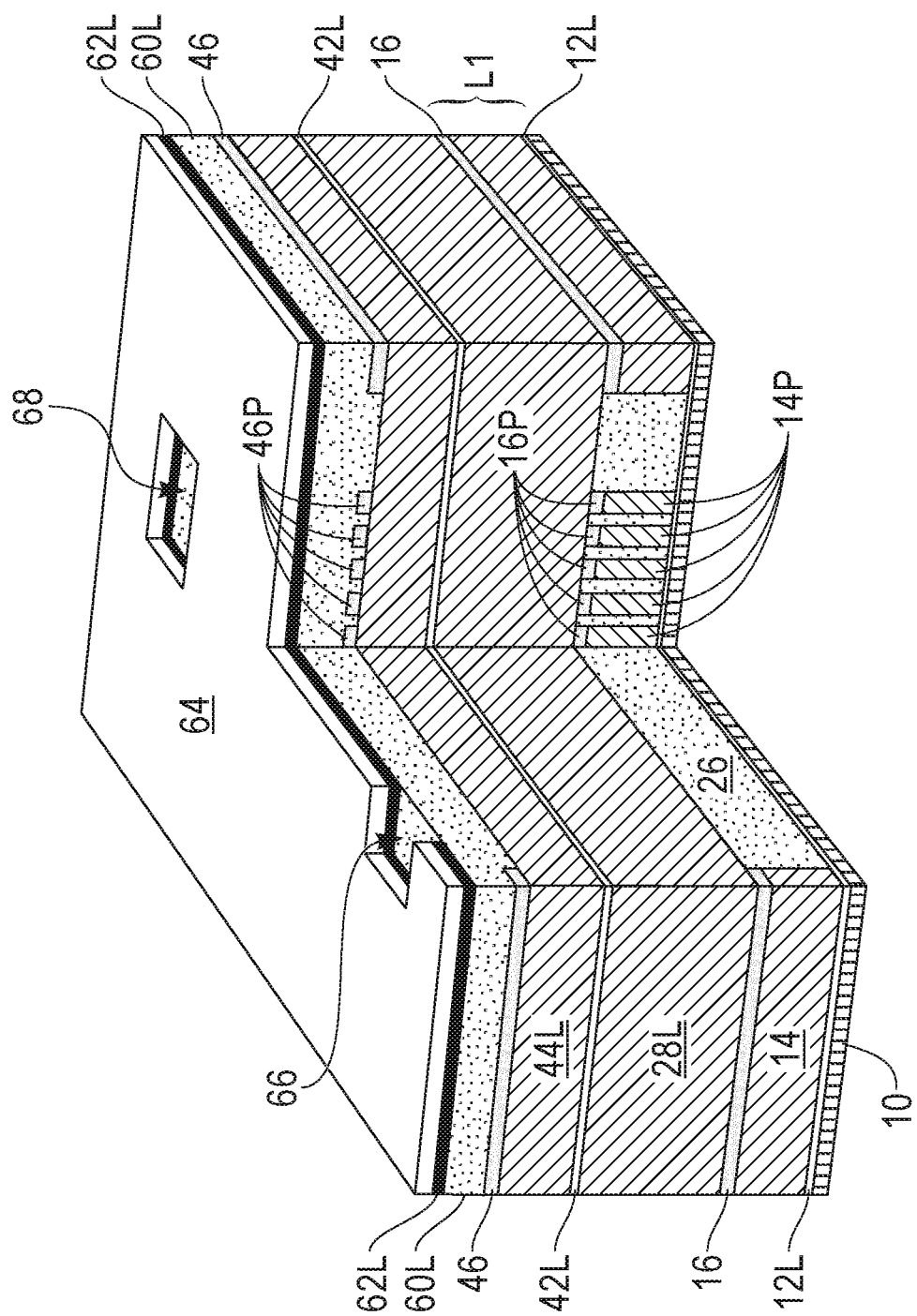

FIG. 13 is a 3D representation of the multilayered material stack of FIG. 12 after forming an optical stack and a patterned photoresist containing first and second lower level inlet/outlet openings, wherein the first and second lower level inlet/outlet openings extend into an antireflective coating layer of the optical stack.

Figure 14:
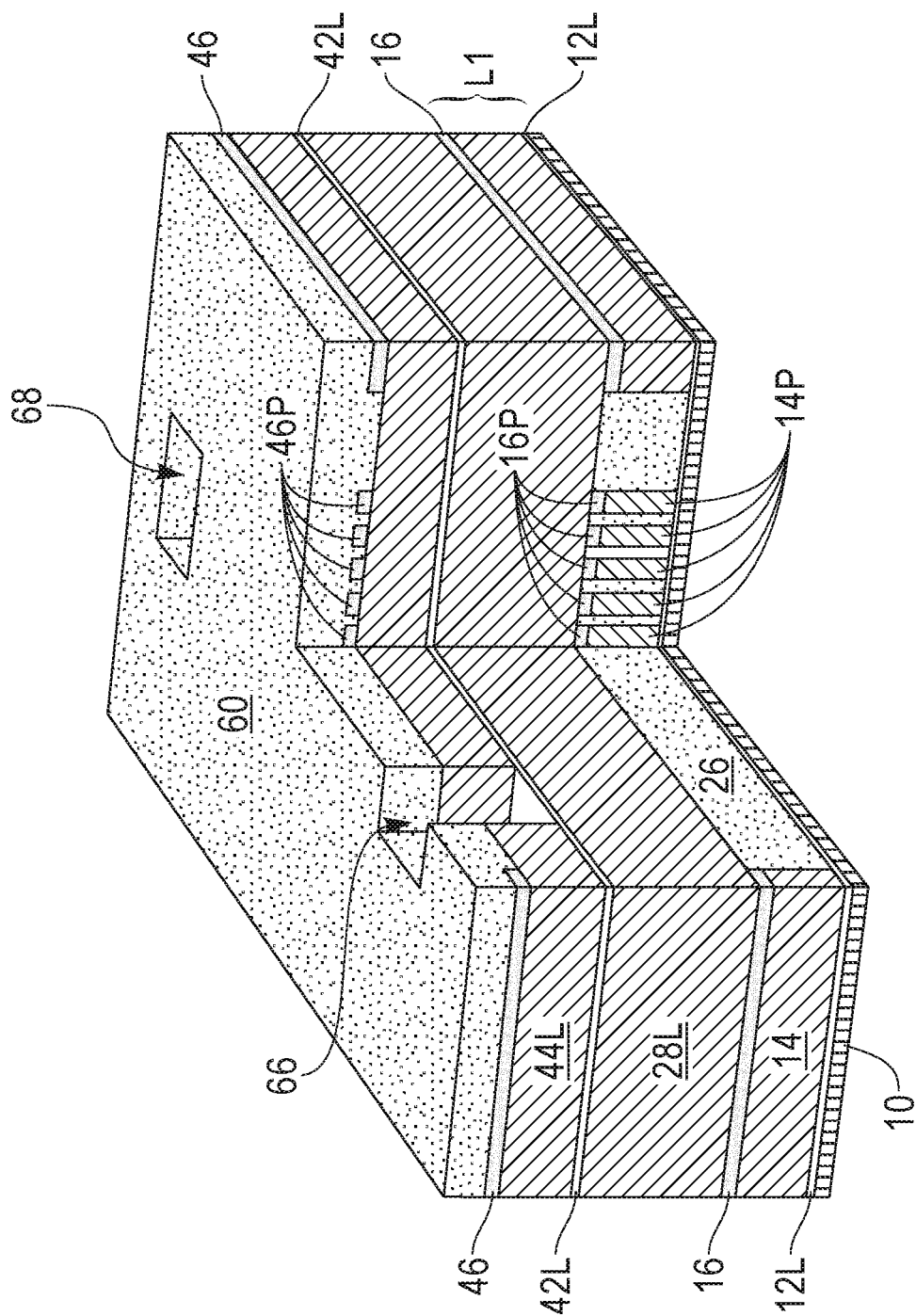

FIG. 14 is a 3D representation of the multilayered material stack of FIG. 13 after transferring the first and second lower level inlet/outlet openings into an organic planarization layer (OPL) of the optical stack, and the third inorganic dielectric material layer.

Figure 15:
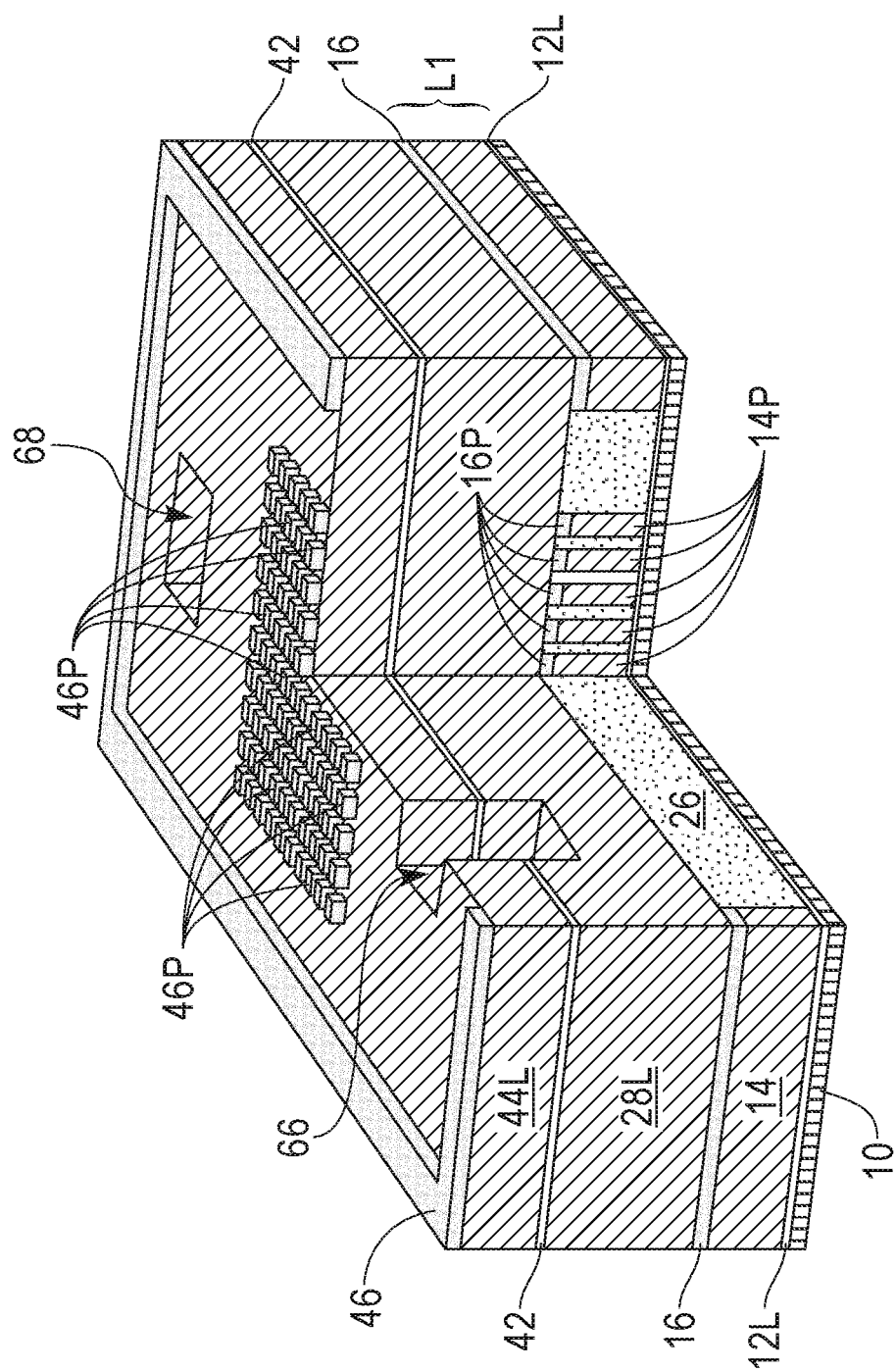

FIG. 15 is a 3D representation of the multilayered material stack of FIG. 14 after removing physically exposed portions of the second pad dielectric material layer and underlying portions of the second inorganic dielectric material, and removing the OPL.

Figure 16:
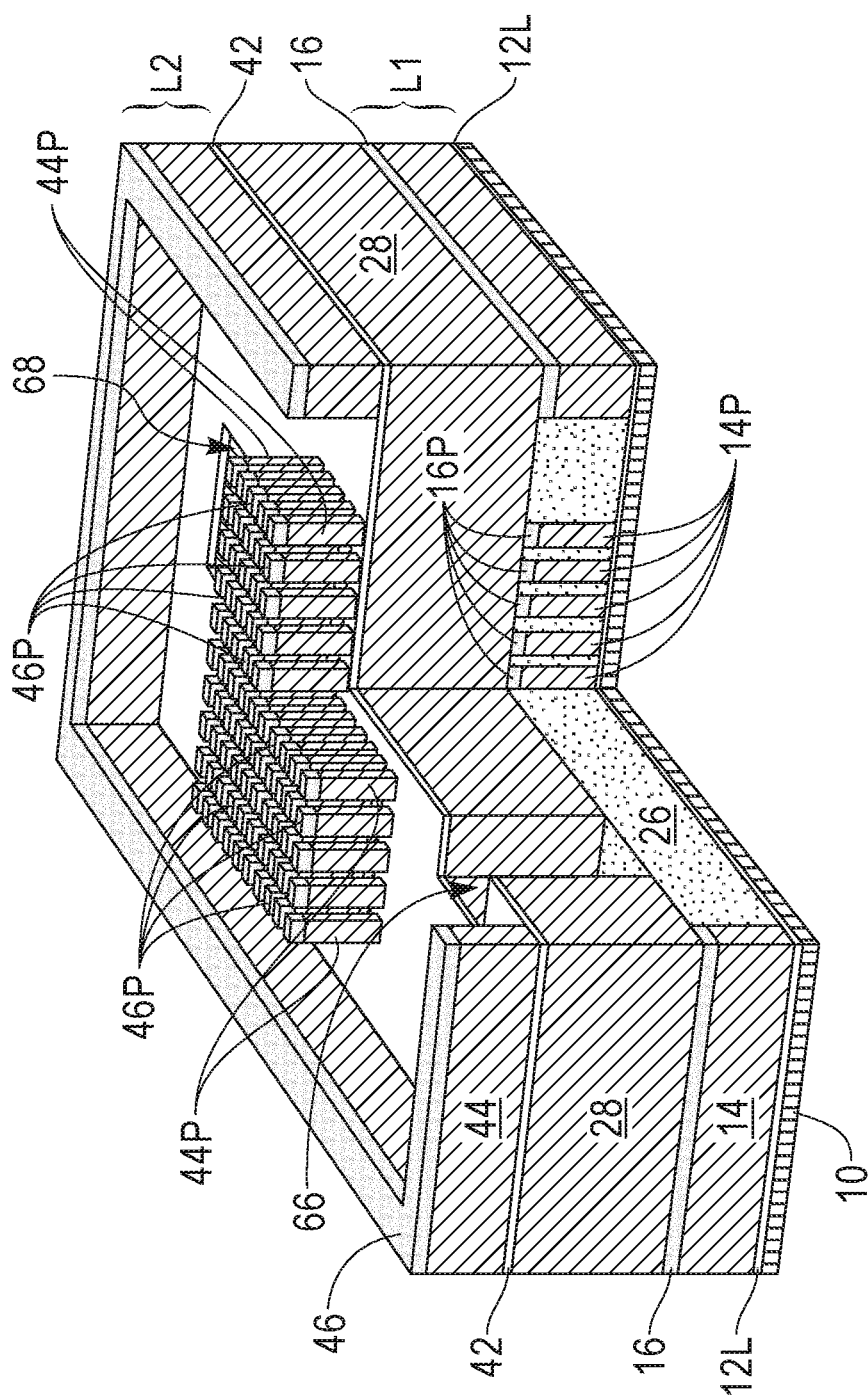

FIG. 16 is a 3D representation of the multilayered material stack of FIG. 15 after transferring the array of pillars into the third inorganic dielectric material to provide an array of second pillars.

Figure 17:
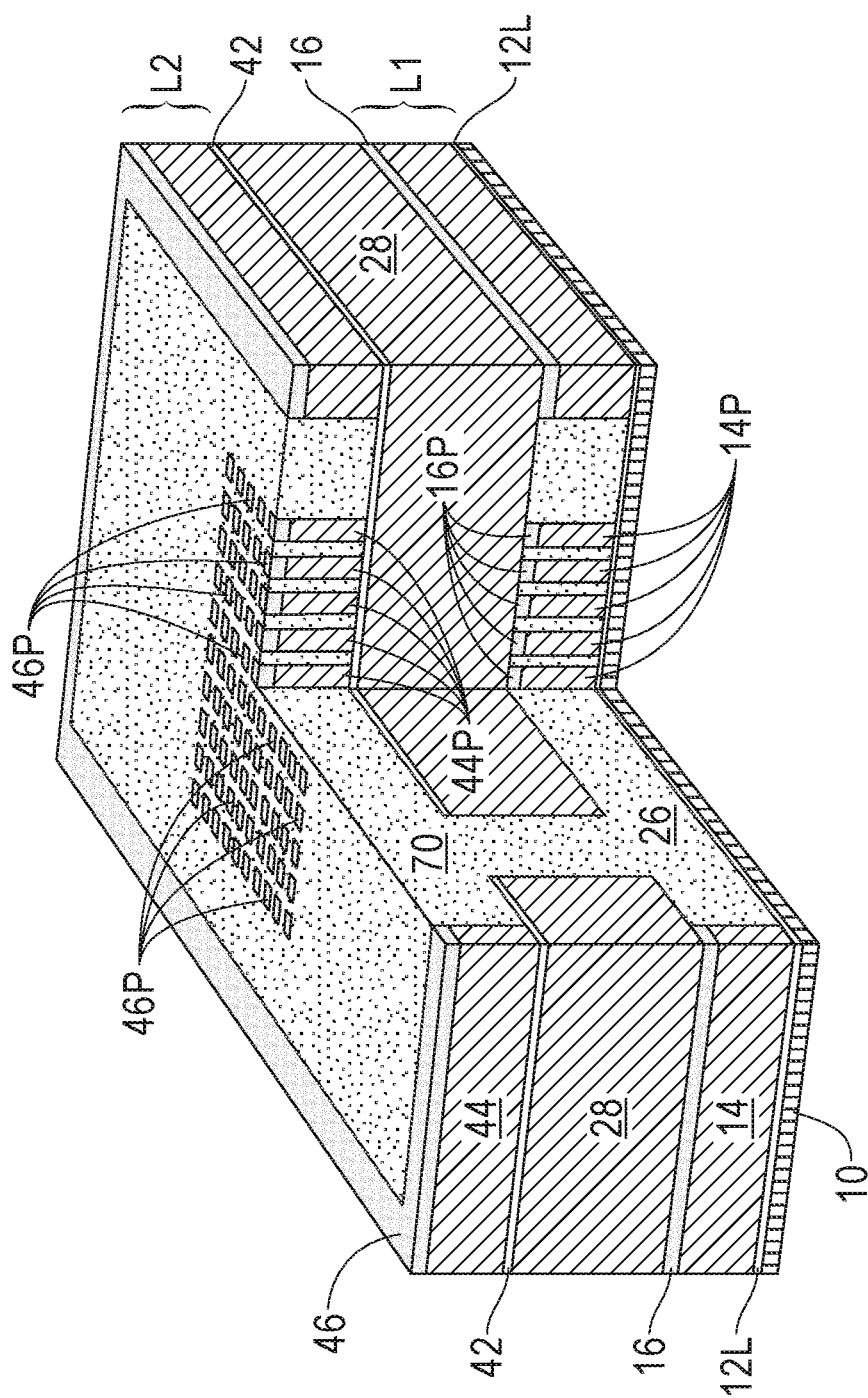

FIG. 17 is a 3D representation of the multilayered material stack of FIG. 16 after forming a spin-on carbon material.

Figure 18:
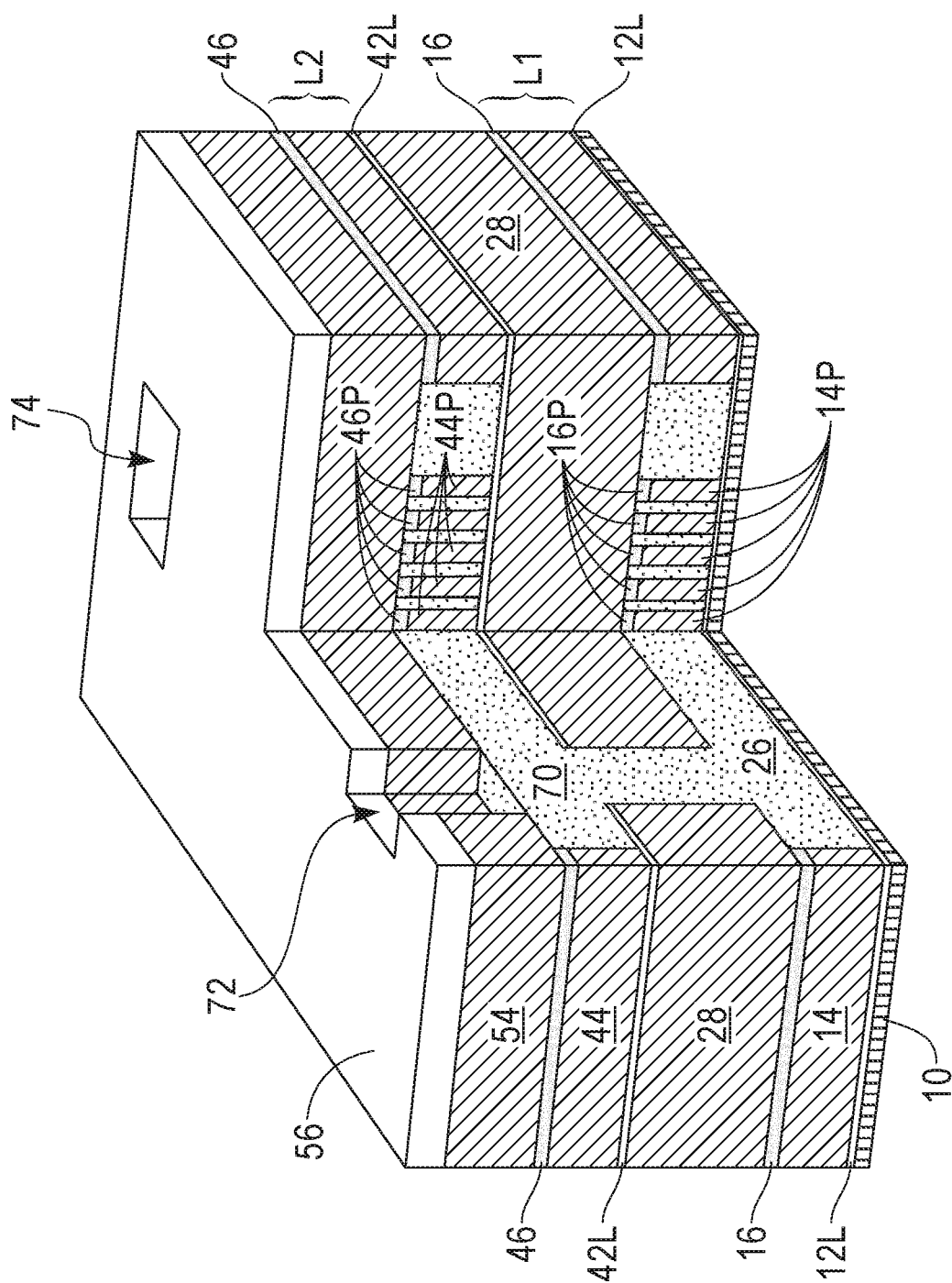

FIG. 18 is a 3D representation of the multilayered material stack of FIG. 17 after forming a fourth inorganic dielectric material including upper level inlet/outlet openings formed therein.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. The drawings only show a region in which a multilayer microfluidic chip in accordance with the present application is formed. In the drawings, a portion of each structure is cut out for illustrative purposes only. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a method to form a microfluidic chip containing multilayer microfluidic channels based on pillar arrays is provided. In general terms, the method uses lithography and etching to create a pillar array in target material such as, for example, an inorganic dielectric material, polycrystalline silicon or amorphous silicon. After forming the pillar array, a spin-on carbon material or other like sacrificial gap filling material is applied to fill in the gaps in the pillar array. Next, coating and a material removal process is used to planar the surface and reveal the topmost surface of each pillar within the pillar array. A sealing layer is then deposited. A second lithographic and etching is used to define inlet/outlet openings to provide access to the microfluidic channels. The openings are then planarized and sealed as the pillar layer. The above cycle can be repeated any number of times as needed. After the inlet/outlet opening formation of the last cycle, a material removal process such as, for example oxygen plasma or a wet etch, is used to remove all of the sacrificial gap filling material. The pillars in each pillar array may or may not use different designs, i.e., critical dimensions and layout. Pillar height of each microfluidic layer can be adjusted as needed.

Referring first to FIGS. 1-11, there is illustrated one embodiment of the present application which can be used in creating a multilayer microfluidic chip using spin-on carbon as a sacrificial gap filling material and an inorganic dielectric material as a target pillar forming material. Although spin-on carbon is described an illustrated, other sacrificial gap filling materials can be used in the present application. Also, and although an inorganic dielectric material is described and illustrated as the target pillar forming material, other target pillar forming materials besides an inorganic dielectric material can be employed in the present application. In this embodiment, two vertically stacked microfluidic channel layers (L1, L2) are described and illustrated. It is noted that although the description and drawings illustrate and describe the formation of two vertically stacked microfluidic channel layers (L1, L2), the present application is not limited to forming that number of vertically stacked microfluidic channel layers; in the present application two vertically stacked microfluidic channel layers (L1, L2) represents a minimum number of vertically stacked microfluidic channel layers that are present in the multilayer microfluidic chip.

Figure 1:
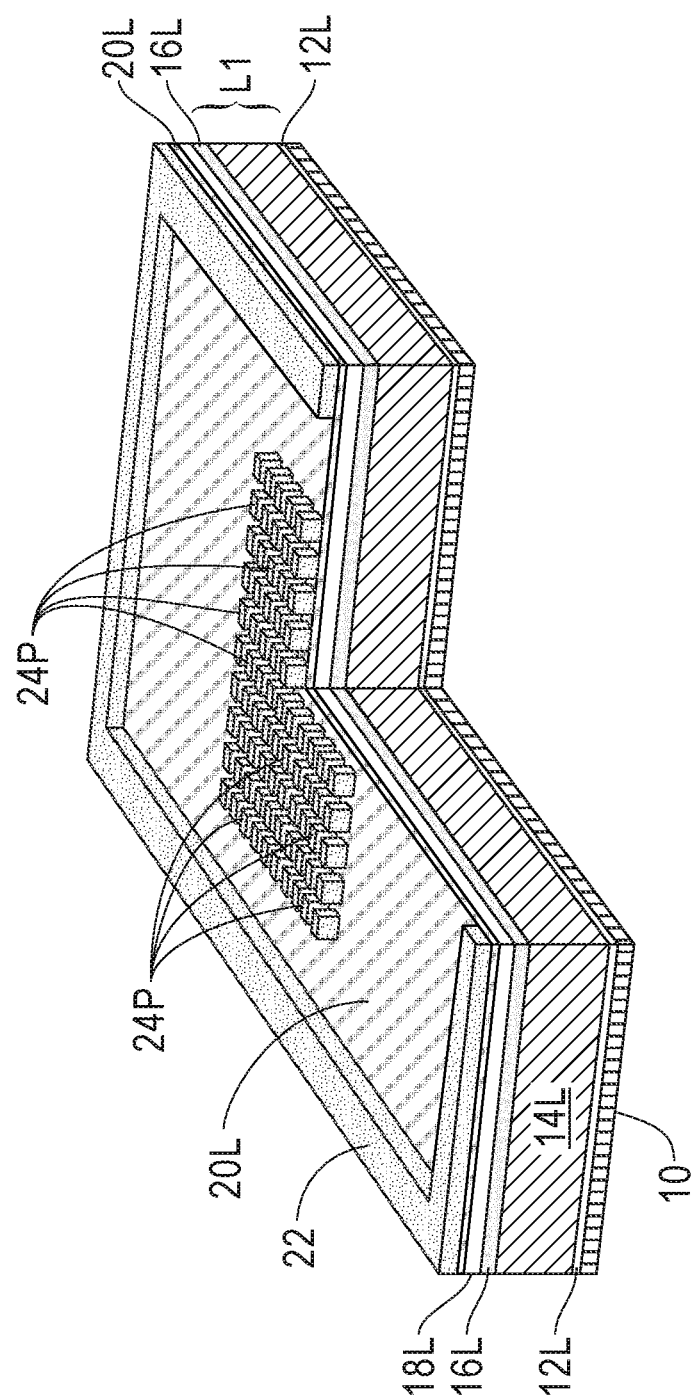

Referring now to FIG. 1, there is illustrated a multilayered material stack that can be initially used in creating the multilayer microfluidic chip of the present application. As is shown in FIG. 1, the multilayered material stack includes, from bottom to top, a substrate 10, a first pad dielectric material layer 12L, a first inorganic dielectric material layer 14L, a first hard mask material layer 16L, a first optical coating stack (18L, 20L), and a first patterned photoresist 22 including an array of first pillar shaped patterns 24P formed therein. Layer 14L may also be formed as a first pillar forming material layer.

In one embodiment of the present application, the substrate 10 that can be used in the present application may include a glass substrate. In another embodiment of the present application, the substrate 10 may include a semiconductor material. The term "semiconductor material" denotes a material that has semiconducting properties. Examples of semiconductor materials that can be used as substrate include, but are not limited to, silicon (Si), a silicon germanium (SiGe) alloy, a silicon germanium carbide (SiGeC) alloy, germanium (Ge), a III/V compound semiconductor or a II/VI compound semiconductor. In one example, silicon is used as the substrate 10.

In embodiments in which a semiconductor material is employed as the substrate 10, the substrate 10 may be a bulk semiconductor substrate or a semiconductor-on-insulator (SOI) substrate. By "bulk semiconductor substrate", it is meant a substrate that is entirely composed of at least one semiconductor material, as defined above. An SOI substrate includes a handle wafer, an insulator layer and a topmost semiconductor material layer. When an SOI substrate is employed as substrate 10, the topmost semiconductor material layer provides a surface in which the multilayer microfluidic chip of the present application is formed.

First pad dielectric material layer 12L is formed on a topmost surface of the substrate 10. The first pad dielectric material layer 12L is a contiguous layer that can be composed of an oxide, a nitride or an oxynitride. In one example, the first pad dielectric material layer 12L is composed of silicon dioxide. In some embodiments, the first pad dielectric material layer 12L can be formed utilizing a deposition process such as, for example, chemical vapor deposition (CVD), plasma enhanced chemical vapor deposition (PECVD), atomic layer deposition (ALD) or physical vapor deposition (PVD). In other embodiments, the first pad dielectric material layer 12L can be formed utilizing a thermal growth process such as, for example, thermal oxidation or thermal nitridation. The first pad dielectric material layer 12L can have a thickness from 20 nm to 150 nm. Other thicknesses that are lesser than 20 nm, or greater than 150 nm may also be employed in the present application for the thickness of the first pad dielectric material layer 12L.

First inorganic dielectric material layer 14L is formed on a topmost surface of the first pad dielectric material layer 12L. The first inorganic dielectric material layer 14L is a contiguous layer that is compositionally different from the first pad dielectric material layer 12L. In one embodiment of the present application, and when the first pad dielectric material layer 12L is composed of silicon dioxide, the first inorganic dielectric material layer 14L is composed of silicon nitride. Other examples of inorganic materials that may be employed as the first inorganic dielectric material layer 14L include, but are not limited to, silicon dioxide. The first inorganic dielectric material layer 14L can be formed utilizing a deposition process such as, for example, CVD, PECVD, ALD or PVD. The first inorganic dielectric material layer 14L typically has a thickness from 100 nm to 1000 nm; although other thicknesses are contemplated. In some embodiments of the present application, the first inorganic dielectric material layer 14L may be replaced with a layer of polycrystalline silicon or amorphous silicon.

First hard mask material layer 16L is formed on a topmost surface of the first inorganic dielectric material layer 14L. The first hard mask material layer 16L is a contiguous layer that is composed of a hard mask material that is compositionally different from the first inorganic dielectric material layer 14L. Examples of hard mask materials that can be employed as the first hard mask material layer 16L include, but are not limited to, amorphous silicon, silicon dioxide, hafnium oxide, aluminum oxide, titanium oxide or titanium nitride. The first hard mask material layer 16L can be formed utilizing a deposition process such as, for example, CVD, PECVD, ALD or PVD. The first hard mask material layer 16L typically has a thickness from 20 nm to 150 nm; although other thicknesses are contemplated.

First optical coating stack (18L, 20L) is formed on a topmost surface of the first hard mask material layer 16L. The first optical coating stack is typically composed of an organic planarization layer (OPL) 18L and an anti-reflective coating (ARC) layer 20L. In some embodiments, the first optical coating (18L, 20L) is entirely omitted. In other embodiments, at least one of the OPL 18L or the ARC layer 20L can be omitted.

The OPL 18L may include a material(s) such as spin-on carbon (SOC), diamond-like carbon, polyarylene ether, polyimide, polymethyl methacrylate, polymethylisopropenyl ketone, or photoresists. The OPL 18L can be formed utilizing a deposition process including, for example, CVD, PVD, PECVD, evaporation, spin coating, or dip coating. The OPL 18L may have a thickness from 50 nm and 200 nm, although lesser and greater thicknesses can also be employed as the thickness of the OPL 18L.

The ARC layer 20L may include an organic ARC a silicon-ARC, and/or a titanium-ARC. The ARC layer 20L can by formed by a deposition process including, for example, CVD, PVD, PECVD, evaporation, spin coating, or dip coating. The ARC layer 20L may have a thickness from 20 nm and 50 nm, although lesser and greater thicknesses can also be employed as the thickness of the ARC layer 20L.

First patterned photoresist 22 including an array of first pillar shaped patterns 24P is formed upon the first optical coating stack (18L, 20L). If the first optical coating stack (18L, 20L) is omitted, the first patterned photoresist 22 including the array of first pillar shaped patterns 24P can be formed upon the first hard mask material layer 16L. The first patterned photoresist 22 including the array of first pillar shaped patterns 24P may be formed by applying a photoresist to the material layers that are to be patterned and then lithographically patterning the photoresist. Lithographic patterning includes resist exposure and development. It is noted that the array of first pillar shaped patterns 24P will be used to define an array of pillars within the first inorganic dielectric material layer 14L. The array of first pillar shaped patterns 24P includes a plurality of pillar shaped patterns that are spaced apart from each. Each pillar shaped pattern is identical and may have any shape including, but not limited to, cylindrical, square, or rectangular. The distance between each pillar shaped pattern may be from 25 nm to 250 nm. It is noted that the patterned photoresist material 22 that laterally surrounds the array of first pillar shaped patterns 24P will define the outer surfaces of the microfluidic chip of the present application.

Figure 2:
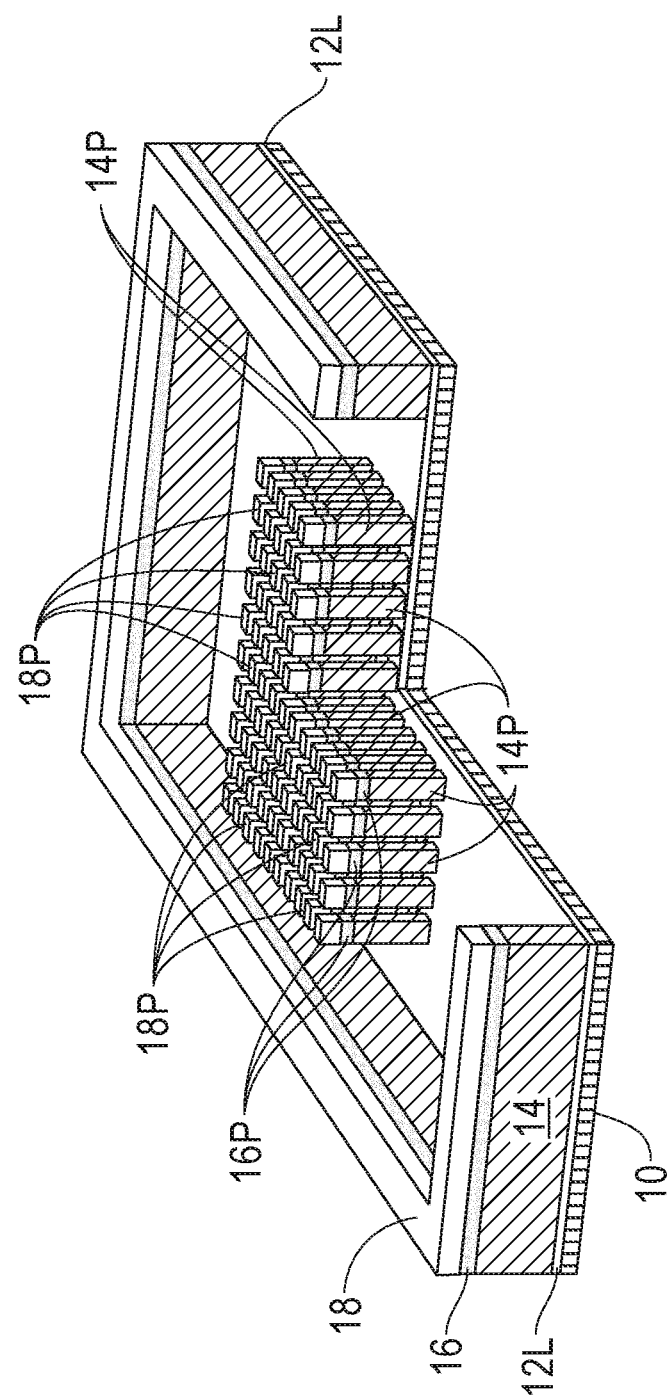
FIG. 2 is a 3D representation of the multilayered material stack of FIG. 1 after transferring the pattern of the first patterned photoresist including the array of first pillar shaped patterns into the underlying first optical coating stack, first hard mask material layer, and first inorganic dielectric material layer, and removing the first patterned photoresist.

Referring now to FIG. 2, there is illustrated the multilayered material stack of FIG. 1 after transferring the pattern of the first patterned photoresist 24 including the array of first pillar shaped patterns 24P into the underlying first optical coating stack (18L, 20L), first hard mask material layer 16L, and first inorganic dielectric material layer 14L, and removing the first patterned photoresist 24 including the array of first pillar shaped patterns 24P as well as remaining portions of the ARC layer 20L, if present.

The transferring of the pattern of the first patterned photoresist 24 including the array of first pillar shaped patterns 24P into the underlying first optical coating stack (18L, 20L), first hard mask material layer 16L, and first inorganic dielectric material layer 14L may include one or more anisotropic etching steps. In one example, one or more reactive ion etching processes are used to perform this transfer.

The removal of the first patterned photoresist 24 including the array of first pillar shaped patterns 24P as well as remaining portions of the ARC layer 20L, if present, may be performed utilizing one or more material removal process including, for example, stripping or ashing; the material removal process stops on a topmost surface of the first pad dielectric material layer 12L. An upper portion or all of the remaining OPL may be removed during this removal step as well.

After transferring of the pattern of the first patterned photoresist 24 including the array of first pillar shaped patterns 24P into the underlying first optical coating stack (18L, 20L), first hard mask material layer 16L, and the first inorganic dielectric material layer 14L portions of each of the material layers remain. Notably, portions of the OPL 18L, the first hard mask material layer 16L, and the first inorganic dielectric material layer 14L remain.

The remaining portions of the OPL 18L, the first hard mask material layer 16L, and the first inorganic dielectric material layer 14L that lay beneath the patterned first photoresist 24 define the outer surfaces of the microfluidic chip of the present application. The remaining portion of the OPL 18L that defines outer surfaces of the microfluidic chip of the present application can be referred to herein as an OPL wall portion 18, the remaining portion of the first hard mask material layer 16L that defines outer surfaces of the microfluidic chip of the present application can be referred to herein as a first hard mask wall portion 16, and the remaining portion of the first inorganic dielectric material layer 14L that defines outer surfaces of the microfluidic chip of the present application can be referred to herein as a first inorganic dielectric wall portion 14.

The remaining portions of the OPL 18L, the first hard mask material layer 16L, and the first inorganic dielectric material layer 14L that lay beneath the array of first pillar shaped patterns 24P define an array of first pillars. The first pillars have a same shape and dimensions as the first pillar shaped patterns 24P and are spaced apart from each other by the distance mentioned above for the first pillar shaped patterns 24P. Each first pillar includes a OPL portion 18P, a first hard mask material portion 16P, and a first inorganic dielectric material portion 14P. As is illustrated in FIG. 2, a gap exists between the outermost first pillars of the array of first pillars and the wall portions (14/16/18).

Referring now to FIG. 3, there is illustrated the multilayered material stack of FIG. 2 after forming a first spin-on carbon fill material 26 within walls portions of the remaining portions of multilayered material stack (and laterally surrounding each first pillar of the array of first pillars), and performing a material removal process such as, for example, etching and/or planarization (i.e., chemical mechanical polishing). The OPL wall portion 18 can be removed prior to the forming of the first spin-on carbon fill material by ashing or wet etching.

The first spin-on carbon fill material 26 can be formed utilizing CVD, PVD, PECVD, spin-coating or evaporation. Although the present application describes and illustrates the use of a spin-on carbon material to fill the gaps, other sacrificial fill materials besides spin-on carbon may be used provided that the other sacrificial fill materials such as, amorphous carbon, may be used in gap filling and can be easily and selectively removed from the final structure. Prior to the material removal process, a portion of the first spin-on carbon fill material 26 is present atop the wall portions of the remaining portions of the multilayered material stack and each first pillar of the array of first pillars. The material removal process removes the first spin-on carbon fill material 26 present atop the wall portions of the remaining portions of the multilayered material stack and each first pillar of the array of first pillars as well as the OPL wall portion 18 and the OPL portion 18P.

A first microfluidic channel layer, L1, of the microfluidic chip of the present application is formed. The first microfluidic channel layer, L1, includes an array of first pillars in which each pillar is now composed of the first hard mask material portion 16P and the first inorganic dielectric material portion 14P. This first array is surrounded by wall portions defined by the first hard mask wall portion 16 and the first inorganic dielectric wall portion 14.

Figure 4:
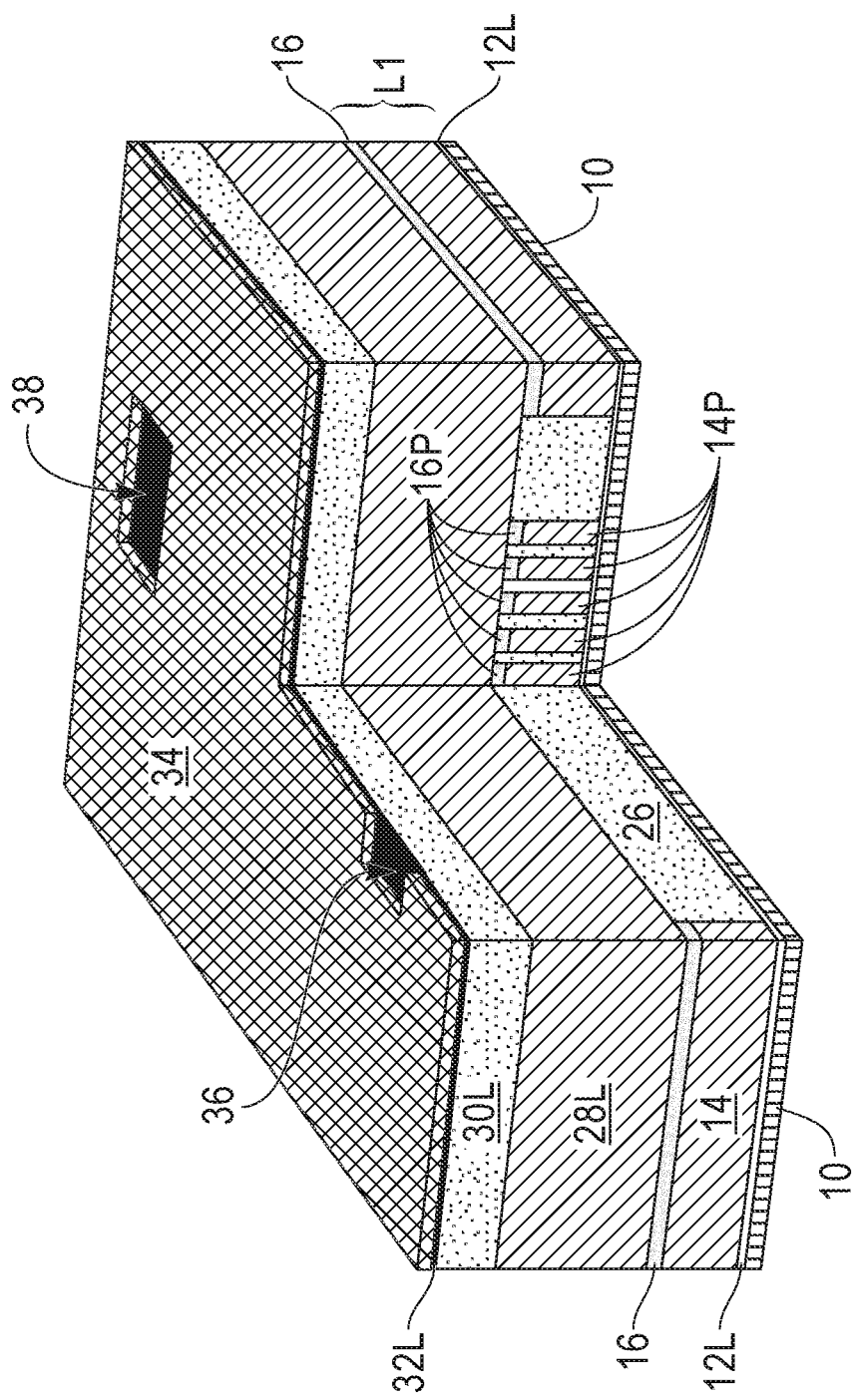
FIG. 4 is a 3D representation of the multilayered material stack of FIG. 3 after forming a second inorganic dielectric material layer, a second optical coating stack, and a second patterned photoresist including a first lower level inlet/outlet opening and a second lower level inlet/outlet opening formed therein.

Referring now to FIG. 4, there is illustrated the multilayered material stack of FIG. 3 after forming a second inorganic dielectric material layer 28L, a second optical coating stack (30L, 32L), and a second patterned photoresist 34 including a first lower level inlet/outlet opening 36 and a second lower level inlet/outlet opening 38 formed therein. In FIG. 4 and for brevity reason, the first and second lower level inlet/outlet openings (36, 38) are present within the ARC layer 32L at this point of the present application. Second inorganic dielectric material layer 28L may also be referred to herein as a microfluidic channel separating material layer.

The second inorganic dielectric material layer 28L may include one of the inorganic dielectric materials mentioned above for the first inorganic dielectric material layer 14L. In some embodiments, the second inorganic dielectric material layer 28L is composed of a same inorganic dielectric material as the first inorganic dielectric material layer 14L. In other embodiments, the second inorganic dielectric material layer 28L is composed of a different inorganic dielectric material than the first inorganic dielectric material layer 14L. The second inorganic dielectric material layer 28L can be formed utilizing one of the deposition processes mentioned above in forming the first inorganic dielectric material layer 14L. The second inorganic dielectric material layer 28L has a thickness that may be the same as, or different from, the thickness of the first inorganic dielectric material layer 14L. In some embodiments, the second inorganic dielectric material layer 28L may be replaced with a layer of polycrystalline silicon or amorphous silicon.

The second optical coating stack (30L, 32L) may include a second OPL 30L and a second ARC 32L. At least one of the OPL 30L and ARC 32L of the second optical coating stack (30L, 32L) can be omitted in some applications.

The second OPL 30L may include one of the materials mentioned above for the first OPL 18L, it may be formed utilizing one of the deposition processes mentioned above for forming the first OPL 18L, and it may have a thickness within the thickness range mentioned above for the first OPL 18L.

The second ARC 32L may include one of the materials mentioned above for the first ARC layer 20L, it may be formed utilizing one of the deposition processes mentioned above for forming the first ARC layer 20L, and it may have a thickness within the thickness range mentioned above for the first ARC layer 20L.

The second patterned photoresist 34 including the first lower level inlet/outlet opening 36 and the second lower level inlet/outlet opening 38 may be formed by depositing a photoresist material, and lithographically patterning the photoresist material to include the first and second lower level inlet/outlet openings (36, 38).

Figure 5:
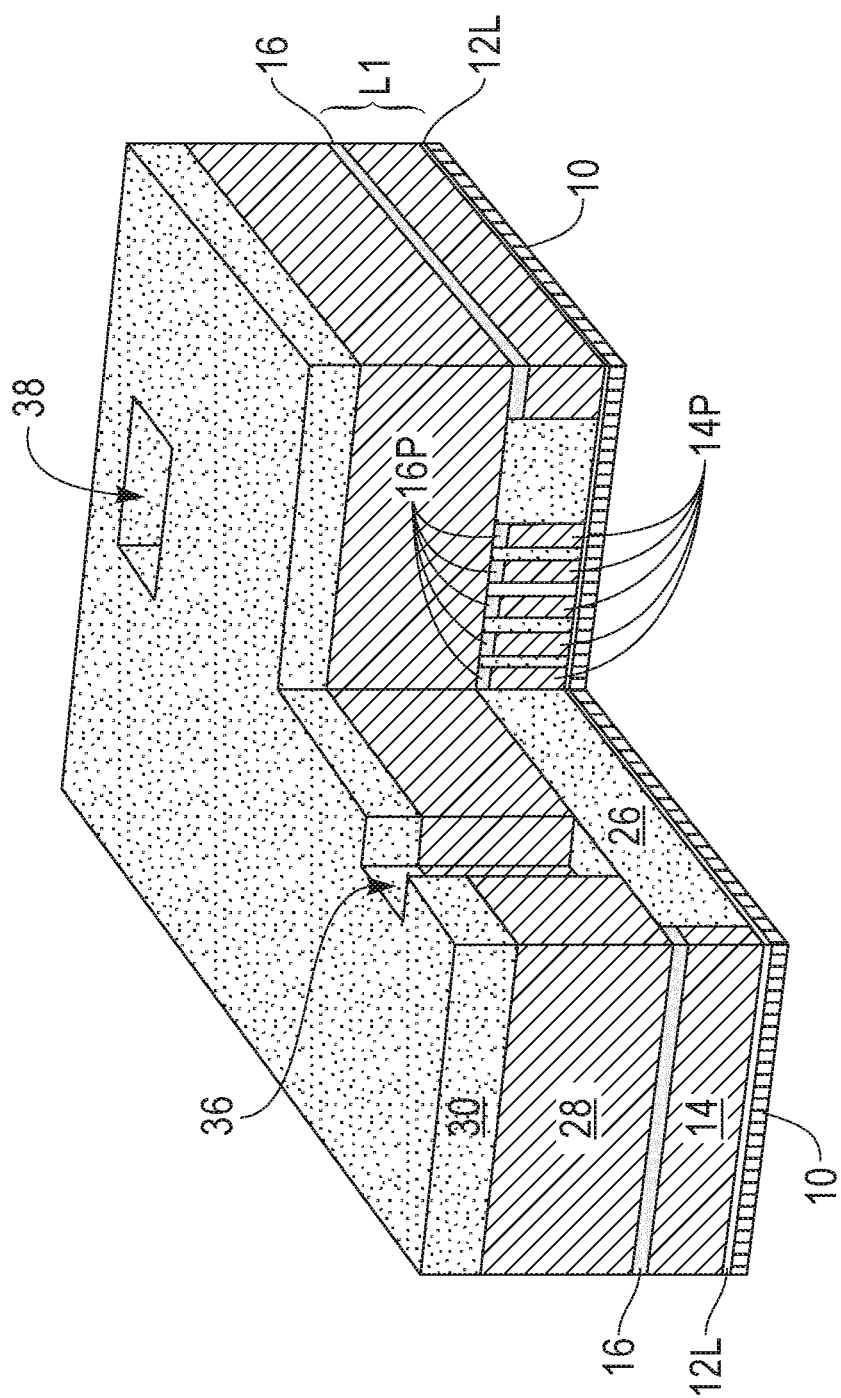
FIG. 5 is a 3D representation of the multilayered material stack of FIG. 4 after transferring the first lower level inlet/outlet opening and the second lower level inlet/outlet opening into the second optical coating stack, and the second inorganic dielectric material layer, and removing the second patterned photoresist.

Referring now to FIG. 5, there is illustrated the multilayered material stack of FIG. 4 after transferring the first lower level inlet/outlet opening 36 and the second lower level inlet/outlet opening 38 into the second optical coating stack (28L, 30L), and the second inorganic dielectric material layer 28L, and removing the second patterned photoresist 34; during removal of the second patterned photoresist 34, the ARC layer (i.e., the second ARC layer 32L) of the second optical coating is also removed.

The transferring of the first lower level inlet/outlet opening 36 and the second lower level inlet/outlet opening 38 into the second optical coating stack (28L, 30L), and the second inorganic dielectric material layer 28L may be performed utilizing one or more anisotropic etching processes. In one example, this transferring step includes one or more reactive ion etching processes. After transferring the first lower level inlet/outlet opening 36 and the second lower level inlet/outlet opening 38, portions of the second optical coating stack and the second inorganic dielectric material layer remain. The remaining portion of the second optical coating stack includes a second OPL portion 30. The remaining portion of the second inorganic dielectric material layer 28L may be referred to as a second inorganic dielectric material portion 28.

The removal of the second patterned photoresist 34 and second ARC layer 32L can be performed utilizing any material removal process including stripping or ashing.

Referring now to FIG. 6, there is illustrated the multilayered material stack of FIG. 5 after forming a second spin-on carbon fill material 40 within the first lower level inlet/outlet opening 36 and a second lower level inlet/outlet opening 38, and performing a material removal process.

The second spin-on carbon fill material 40 can be formed utilizing one of the deposition processes mentioned above for forming the first spin-on carbon fill material 26. Although the present application describes and illustrates the use of a spin-on carbon material to fill the first lower level inlet/outlet opening 36 and the second lower level inlet/outlet opening 38, other sacrificial fill materials, as defined above, besides spin-on carbon may be used. Prior to the material removal process, a portion of the second spin-on carbon fill material 40 is present atop the second OPL portion 30. The material removal process removes the second spin-on carbon fill material 40 as well as second OPL portion 30 that is present atop a topmost surface of the second inorganic dielectric material portion 28.

Referring now to FIG. 7, there is illustrated the multilayered material stack of FIG. 6 after forming a second pad dielectric material layer 42L, a third inorganic dielectric material layer 44L, a second hard mask material layer 46L, a third optical coating stack, a third patterned photoresist 50 including an array of second pillar shaped patterns 50P formed therein, and transferring the array of second pillar shaped patterns 50P into the third optical coating stack. In the illustrated embodiment depicted in FIG. 7, the third optical coating stack includes only a third OPL which, after pattern transfer includes a third OPL wall portion 48 and a third OPL pillar portion 48P. In some embodiments, the third optical coating stack may also include a third ARC (not shown). The third inorganic dielectric material layer 44L may also be referred to herein as a second pillar forming material layer.

The second pad dielectric material layer 42L, which is formed upon the physically exposed surfaces shown in FIG. 6, may include one of the dielectric materials mentioned above for the first pad dielectric material layer 12L. In some embodiments, the second pad dielectric material layer 42L is composed of a same dielectric material as the first pad dielectric material layer 12L. In other embodiments, the second pad dielectric material layer 42L is composed of a different dielectric material than the first pad dielectric material layer 12L. The second pad dielectric material layer 42L can be formed utilizing one of the deposition processes mentioned above in forming the first pad dielectric material layer 12L. The second pad dielectric material layer 42L has a thickness that may be the same as, or different from, the thickness of the first pad dielectric material layer 12L.

The third inorganic dielectric material layer 44L, which is formed on the topmost surface of the second pad dielectric material layer 42L, may include one of the inorganic dielectric materials mentioned above for the first inorganic dielectric material layer 14L. In some embodiments, the third inorganic dielectric material layer 44L is composed of a same inorganic dielectric material as the first inorganic dielectric material layer 14L and/or the second inorganic dielectric material layer 28L. In other embodiments, the third inorganic dielectric material layer 44L is composed of a different inorganic dielectric material than the first inorganic dielectric material layer 14L and/or the second inorganic dielectric material layer 28L. The third inorganic dielectric material layer 44L can be formed utilizing one of the deposition processes mentioned above in forming the first inorganic dielectric material layer 14L. The third inorganic dielectric material layer 44L has a thickness that may be the same as, or different from, the thickness of the first inorganic dielectric material layer 14L. In some embodiments, the third inorganic dielectric material layer 44L may be replaced with a layer of polycrystalline silicon or amorphous silicon.

The second hard mask material layer 46L, which is formed upon a topmost surface of the third inorganic dielectric material layer 44L, may include one of the hard mask materials mentioned above for the first hard mask material layer 16L. In some embodiments, the second hard mask material layer 46L is composed of a same hard mask material as the first hard mask material layer 16L. In other embodiments, the second hard mask material layer 46L is composed of a different hard mask material than the first hard mask material layer 16L. The second hard mask material layer 46L can be formed utilizing one of the deposition processes mentioned above in forming the first hard mask material layer 16L. The second hard mask material layer 46L has a thickness that may be the same as, or different from, the thickness of the first hard mask material layer 16L.

The third OPL may include one of the materials mentioned above for the first OPL 18L, it may be formed utilizing one of the deposition processes mentioned above for forming the first OPL 18L, and it may have a thickness within the thickness range mentioned above for the first OPL 18L.

The third ARC layer may include one of the materials mentioned above for the first ARC layer 20L, it may be formed utilizing one of the deposition processes mentioned above for forming the first ARC layer 20L, and it may have a thickness within the thickness range mentioned above for the first ARC layer 20L.

The third patterned photoresist 50 including the array of second pillar shaped patterns 50P is formed upon the third optical coating stack. The third patterned photoresist 50 including the array of second pillar shaped patterns 50P may be formed by applying a photoresist to the material layers that are to be patterned and then lithographically patterning the photoresist. It is noted that the array of second pillar shaped patterns 50P will be used to define an array of pillars within the third inorganic dielectric material layer 44L. The array of second pillar shaped patterns 50P includes a plurality of pillar shaped patterns that are spaced apart from each. Each pillar shaped pattern is identical and may have any shape including, but not limited to, cylindrical, square, or rectangular. The distance between each pillar shaped pattern may be from 25 nm to 250 nm. The array of second pillar shaped patterns 50P may have a same shape and/or dimensions as the array of first pillar shaped patterns 24P. It is noted that the third patterned photoresist 50 that laterally surrounds the array of second pillar shaped patterns 50 also defines the outer surfaces of the microfluidic chip of the present application. A first etch may be used to transfer the pattern of the third patterned photoresist 50 including the array of second pillar patterns into the third OPL. In the drawings, element 48 defines a third OPL wall portion, and element 48P defines OPL pillar portions.

Referring now to FIG. 8, there is illustrated the multilayered material stack of FIG. 7 after completing the transferring of the array of second pillar shaped patterns 50P into the underlying second hard mask material layer 46L, the third inorganic dielectric material layer 44L, and removing the third patterned photoresist 50 including the array of second pillar shaped patterns 50P.

The completion of the pattern transfer may include one or more anisotropic etching steps. In one example, one or more reactive ion etching process are used to perform this transfer. The removal of the third patterned photoresist 50 including the array of second pillar patterns 50P (and if present any ARC layer) may be performed utilizing one or more material removal process including, for example, stripping or ashing; the material removal process stop on a topmost surface of the second pad dielectric material layer 42L. An upper portion of the remaining third OPL may be removed during this removal step as well.

After the complete pattern transfer of the pattern of the second patterned photoresist 50 including the array of second pillar shaped patterns 50P into the underlying second hard mask material layer 46L, and the third inorganic dielectric material layer 44L portions of each of the material layers remain. Notably, portions of the second hard mask material layer 46L, and the third inorganic dielectric material layer 44L remain.

The remaining portions the second hard mask material layer 46L and the third inorganic dielectric material layer 44L together with the OPL wall portion 48 that lay beneath the patterned third patterned photoresist 50 define the outer surfaces of the microfluidic chip of the present application. The remaining portion of the second hard mask material layer 46L that defines outer surfaces of the microfluidic chip of the present application can be referred to herein as a second hard mask wall portion 46, and the remaining portion of the third inorganic dielectric material layer 44L that defines outer surfaces of the microfluidic chip of the present application can be referred to herein as a third inorganic dielectric wall portion 44.

The remaining portions of the third, the second hard mask material layer 46L, and the third inorganic dielectric material layer 44L that lay beneath the array of second pillar shaped patterns 50P define an array of second pillars. The second pillars have a same shape as the second pillar shaped patterns 50 and are spaced apart from each other by the distance mentioned above for the second pillar shaped patterns 50P. Each second pillar includes a OPL portion 48P, a second hard mask material portion 46P, and a third inorganic dielectric material portion 44P. As is illustrated in FIG. 8, a gap exists between the outermost second pillars of the array of second pillars and the wall portions (44/46/48).

Referring now to FIG. 9, there is illustrated the multilayered material stack of FIG. 8 after removing physically exposed portions of the second pad dielectric material 42L, forming a third spin-on carbon fill material 52 laterally surrounding the second pillars, and performing a material removal process. The removal of the physically exposed portions of the second pad dielectric material 42 can be performed utilizing an anisotropic etching (such as, for example, a reactive ion etch) that is selective in removing the second pad dielectric material 42L. In the drawings, element 42 denotes a wall portion of the second pad dielectric material layer, while element 42P denotes a pillar portion of the second pad dielectric material layer.

The third spin-on carbon fill material 52 can be formed utilizing spin-coating, CVD, PVD, PECVD, or evaporation. Although the present application describes and illustrates the use of a spin-on carbon material to fill the gaps, other sacrificial fill materials, as defined above, besides spin-on carbon may be used. Prior to the material removal process, a portion of the third spin-on carbon fill material 52 is presented atop the third OPL portion 48. The material removal process removes the third spin-on carbon fill material 52 present atop the wall portions (44/46/48) and each second pillar of the array of second pillars as well as the OPL wall portion 48 and the OPL pillar portion 48P.

A second microfluidic channel layer, L2, vertically stacked above the first microfluidic channel layer L1, is formed. The second microfluidic channel layer, L2, includes an array of second pillars in which each second pillar is now composed of the second hard mask material portion 46P and the third inorganic dielectric material portion 44P. This second array is surrounded by wall portions defined by the second hard mask wall portion 46 and the third inorganic dielectric wall portion 44.

Referring now to FIG. 10, there is illustrated the multi-layered material stack of FIG. 9 after forming a fourth inorganic dielectric material layer, and a fourth optical coating stack, and forming a first upper level inlet/outlet opening 58 and a second upper level inlet/outlet opening 60 into the fourth optical coating stack, and the fourth inorganic dielectric material layer. In the drawing, element 54 denotes a remaining portion of the fourth inorganic dielectric material layer, and element 56 denotes a remaining portion of a fourth OPL. The fourth inorganic dielectric material layer may be referred to as a second microfluidic channel separating layer.

The fourth inorganic dielectric material layer may include one of the inorganic dielectric materials mentioned above for the first inorganic dielectric material layer 14L. In some embodiments, the fourth inorganic dielectric material layer is composed of a same inorganic dielectric material as the first inorganic dielectric material layer 14L and/or the second inorganic dielectric material layer 28L and/or the third inorganic dielectric material layer 44L. In other embodiments, the fourth inorganic dielectric material layer is composed of a different inorganic dielectric material than the first inorganic dielectric material layer 14L and/or the second inorganic dielectric material layer 28L and/or third inorganic dielectric material layer 44L. The fourth inorganic dielectric material layer can be formed utilizing one of the deposition processes mentioned above in forming the first inorganic dielectric material layer 14L. The fourth inorganic dielectric material layer 44L has a thickness that may be the same as, or different from, the thickness of the first inorganic dielectric material layer 14L. In some embodiments, the fourth inorganic dielectric material layer may be replaced with a layer of polycrystalline silicon or amorphous silicon.

The fourth OPL may include one of the materials mentioned above for the first OPL 18L, it may be formed utilizing one of the deposition processes mentioned above for forming the first OPL 18L, and it may have a thickness within the thickness range mentioned above for the first OPL 18L. In some embodiments, a fourth ARC is formed on the fourth OPL. If present, the fourth ARC may include one of the materials mentioned above for the first ARC layer 20L, it may be formed utilizing one of the deposition processes mentioned above for forming the first ARC layer 20L, and it may have a thickness within the thickness range mentioned above for the first ARC layer 20L. The fourth OPL and the fourth ARC are components of a fourth optical stack that can be used in the present application.

A fourth patterned photoresist (not shown) including the first lower level inlet/outlet opening 36 and the second lower level inlet/outlet opening 38 is formed atop the fourth optical stack by depositing a photoresist material, and lithographically patterning the photoresist material to include the first and second upper level inlet/outlet openings (58, 60).

After forming the fourth patterned photoresist, the first upper level inlet/outlet opening 58 and the second upper level inlet/outlet opening 60 are transfer into the fourth optical coating stack, and the fourth inorganic dielectric material layer. After pattern transfer, the fourth patterned photoresist as well as any ARC layer are removed utilizing any material removal process including stripping or ashing.

The transferring of the first upper level inlet/outlet opening 58 and the second upper level inlet/outlet opening 60 may be performed utilizing one or more anisotropic etching processes. In one example, this transferring step includes one or more reactive ion etching processes. After transferring the first upper level inlet/outlet opening 58 and the second upper level inlet/outlet opening 60, portions of the fourth optical coating stack and the fourth inorganic dielectric material layer remain. The remaining portion of the fourth optical coating stack includes a fourth OPL portion 56. The remaining portion of the fourth inorganic material layer can be referred to as fourth inorganic dielectric material portion 54.

Referring now to FIG. 11, there is illustrated the multi-layered material stack of FIG. 10 after removing the third, second and first spin-on carbon fill materials (52, 40, 26) to provide a microfluidic device including multilayer microfluidic channels, L1 and L2, in accordance with an embodiment of the present application. Third, second and first spin-on carbon fill materials (52, 40, 26) can be removed utilizing one or more material removal processes that are selective in removing spin-on carbon (or any other sacrificial fill material that is used in lieu of spin-on carbon). In one embodiment, an oxygen plasma may be used to remove all the spin-on carbon from the structure. In another embodiment, a wet etch such as a sulfuric acid/hydrogen peroxide mixture (SPM or Piranha solution) can be used to remove all the spin-on carbon from the structure. In some embodiments, the fourth OPL portion 56 is removed simultaneously with the removal all of the spin-on carbon fill material from the structure. In other embodiments, a separate material removal process such as, for example, planarization, can be used to remove the fourth OPL portion 56.

Notably, FIG. 11 illustrates an exemplary microfluidic chip of the present application that contains multilayer microfluidic channels, L1 and L2, stacked one atop the other. The exemplary microfluidic chip also includes fluid input/output (I/O) ports. The multilayer microfluidic channels, L1 and L2, are in fluid communication with each other since the I/O ports extend from a top portion of the chip to a bottom portion of the chip. The multilayer microfluidic channels, L1 and L2, contain an array of pillars that are spaced apart from each other. The multilayer microfluidic channels, L1 and L2, are also spaced apart from each other.

Additional microfluidic channel layers can be formed by repeating the processing steps as shown in FIGS. 7-11 of the present application. The number of microfluidic channel layers is not limited. Also, and since no bonding is used to create the microfluidic chip of the present application, the cost and yield problems associated with bonding is circumvented. The exemplary microfluidic chip of the present application that contains multilayer microfluidic channels stacked one atop the other as is shown in FIG. 11 also has a high volumetric flow rate, and can be used in a wide variety of applications including, for example, lab-on-a-chip.

Referring now to FIGS. 12-18, there is illustrated another embodiment of the present application which can be used in creating a multilayer microfluidic chip using spin-on carbon as a gap filling material. In this embodiment, two vertically stacked microfluidic channel layers (L1, L2) are described and illustrated. It is noted that although the description and drawings illustrates and describes the formation of two vertically stacked microfluidic channel layers (L1, L2), the present application is not limited to forming that number of vertically stacked microfluidic channel layers; in the present application two vertically stacked microfluidic channel layers (L1, L2) represents a minimum number of vertically stacked microfluidic channel layers that are present in the multilayer microfluidic chip. In this embodiment, any of the inorganic dielectric material layers that are described and illustrated can be replaced with a layer of polycrystalline silicon or amorphous silicon.

Referring first to FIG. 12, there is illustrated the multi-layered material stack of FIG. 3 after forming a second inorganic dielectric material layer 28L (i.e., a first microfluidic channel separating material layer), a second pad dielectric material layer 42L, a third inorganic dielectric material layer 44L (i.e., a second pillar forming material layer), and an array of pillars comprising a second hard mask material 46P and OPL material 48P.

The second inorganic dielectric material layer 28L, the second pad dielectric material layer 42L, the third inorganic dielectric material layer 44L are the same as defined for the previous embodiment of the present application. The second hard mask wall portion 46 housing an array of pillars comprising a second hard mask material 46P and OPL material 48P can be formed by depositing a second hard mask material layer, as defined above, followed by the deposition of the third optical stack as defined above that includes at least the third OPL. Next, a third patterned photoresist containing an array of patterned pillar shapes as defined above is formed, and thereafter etching is used to transfer the pattern of the patterned photoresist containing an array of patterned pillar shapes into the underlying OPL and the second hard mask layer. In the drawing, element 46 represents a wall portion of the second hard mask material layer and element 48 represents a wall portion of the OPL. The third patterned photoresist can be removed after pattern transfer by stripping or ashing as defined above.

Referring now to FIG. 13, there is illustrated the multi-layered material stack of FIG. 12 after forming an optical stack (60L, 62L) and a patterned photoresist 64 containing first and second inlet/outlet openings (66, 68), wherein the first and second lower level inlet/outlet openings (66, 68) extend into an antireflective coating layer 62L of the optical stack. The optical stack (60L, 62L) includes an OPL 60L (including one of the materials defined above for the first OPL layer), and an ARC layer 62L (including one of the materials defined above for the first ARC layer). The optical stack (60L, 62L) can be formed by utilizing any of the deposition processes mentioned above for forming the first optical stack. The patterned photoresist 64 containing first and second lower level inlet/outlet lower level openings (66, 68) includes a photoresist material that has been lithographically patterned to include the first and second lower level inlet/outlet openings (66, 68). The transferring of the first and second lower level inlet/outlet openings (66, 68) into the ARC layer 62L may be performed utilizing an anisotropic etch.

Referring now to FIG. 14, there is illustrated the multi-layered material stack of FIG. 13 after transferring the first and second lower level inlet/outlet openings (66, 68) into an organic planarization layer (OPL) 60L of the optical stack, and the third inorganic dielectric material layer 44L. The transferring may be performed utilizing one or more anisotropic etching processes. The remaining portion of the OPL 62L is designated as OPL portion 62.

Referring now to FIG. 15, there is illustrated the multi-layered material stack of FIG. 14 after removing physically exposed portions of the second pad dielectric material layer 42L and partially etching the underlying portions of the second inorganic dielectric material 28L, and removing the OPL portion 62. The step of the present application includes one or more anisotropic etching processes. In the drawing, element 42 denotes a remaining portion of the second pad dielectric material layer 42L (i.e., second pad dielectric material portion 42). As is shown, the first and second lower level inlet/outlet openings (66 and 68) are partially present in the second inorganic dielectric material layer 28L.

Referring now to FIG. 16, there is illustrated the multi-layered material stack of FIG. 15 after transferring the array of pillars (defined by the second hard mask material 46P) into the third inorganic dielectric material layer 44 to provide an array of second pillars (44P, 46P). Element 44P denotes third inorganic dielectric material pillars that are present beneath an overlying second hard mask material 46P). The step of the present application includes an anisotropic etch such as, for example, reactive ion etching. It is noted that during this etch, the first and second lower level inlet/outlet openings (66 and 68) are completely transferred into second inorganic dielectric material layer 28L. The remaining portion of the second inorganic dielectric material layer 28L is referred to as a second inorganic dielectric material portion 28.

Referring now to FIG. 17, there is illustrated the multi-layered material stack of FIG. 16 after forming a spin-on carbon material 70. Spin-on carbon material 70 may also include any sacrificial material as previously mentioned as a possible replacement for spin-on carbon. Spin-on carbon material 70 can be formed by deposition. A planarization process or etch back process may follow the deposition of the spin-on carbon material 70.

Referring now to FIG. 18, there is illustrated the multilayered material stack of FIG. 17 after forming a fourth inorganic dielectric material 54 (i.e., a second microfluidic channel material layer) including upper level inlet/outlet openings (72 and 74) formed therein. Element 56 is an OPL material that is used in providing the structure shown in FIG. 18. The fourth inorganic dielectric material 54 can include one of the inorganic dielectric materials, polycrystalline silicon or amorphous mentioned above for the first inorganic dielectric material layer 114L. The structure shown in FIG. 18 can be formed by depositing the fourth inorganic material, followed by the deposition of an optical stack including at least OPL material as defined above. A patterned photoresist including the including upper level inlet/outlet openings (72 and 74) is then formed by deposition of a photoresist material and lithographically patterning. The first and second upper level inlet/outlet openings (72 and 74) can then be transferred into the structure by utilizing an anisotropic etch. The first upper level inlet/outlet opening 72 is in fluid communication with the first lower level inlet/outlet opening 66, and the second upper level inlet/outlet opening 74 is in fluid communication with the second lower level inlet/outlet opening 68.

The structure shown in FIG. 18 can be further processed utilizing the techniques described above to provide a structure as shown in FIG. 11 of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a microfluidic chip, the method comprising:
   forming a multilayered material stack including at least a first pillar forming material layer over a substrate;
   forming a first array of first pillars in the first pillar forming material layer of the multilayered material stack;
   filling gaps present between each first pillar of the first array with a first sacrificial gap filling material;
   forming a first microfluidic channel separating material layer over the first array of first pillars and the first sacrificial gap filling material;
   forming a first inlet/outlet opening and a second inlet/outlet opening in the first microfluidic channel separating material layer, wherein the first and second inlet/outlet openings contact the first sacrificial gap filling material;
   forming a second sacrificial gap filling material in the first and second inlet/outlet openings and contacting the first sacrificial gap filling material;
   forming a second pillar forming material layer on the second sacrificial gap filling material and the a first microfluidic channel separating material layer;
   forming a second array of second pillars in the second pillar forming material layer;
   filling gaps present between each second pillar of the second array with a third sacrificial gap filling material;
   forming a second microfluidic channel separating material layer over the second array of second pillars and the third sacrificial gap filling material;
   forming a first upper inlet/outlet opening and a second upper inlet/outlet opening in the second microfluidic channel separating material layer, wherein the first and second upper inlet/outlet openings contact the third sacrificial gap filling material; and
   removing the first sacrificial gap filling material, the second sacrificial gap filling material and the third sacrificial gap filling material.

2. The method of claim 1, wherein the first pillar forming material layer, the first microfluidic channel separating material layer, the second pillar forming material layer, and the second microfluidic channel separating material layer are each composed of an inorganic dielectric material, polycrystalline silicon or amorphous silicon.

3. The method of claim 1, wherein the first sacrificial gap filling material, the second sacrificial gap filling material and the third sacrificial gap filling material are each composed of spin-on carbon or amorphous carbon.

4. The method of claim 1, wherein the first sacrificial gap filling material, the second sacrificial gap filling material and the third sacrificial gap filling material are each composed of spin-on carbon, and the removal of the first sacrificial gap filling material, the second sacrificial gap filling material and the third sacrificial gap filling material comprises utilizing an oxygen plasma.

5. The method of claim 1, wherein the first sacrificial gap filling material, the second sacrificial gap filling material and the third sacrificial gap filling material are each composed of spin-on carbon, and the removal of the first sacrificial gap filling material, the second sacrificial gap filling material and the third sacrificial gap filling material comprises utilizing a sulfuric acid/hydrogen peroxide mixture.

6. The method of claim 1, further comprising a pad dielectric material layer located between the substrate and first pillar forming material layer.

7. The method of claim 1, wherein the multilayered material stack further includes a first hard mask material layer located on the first pillar forming material layer.

8. The method of claim 7, wherein the first array of pillars containing a first hard mask material located thereon.

9. The method of claim 1, wherein prior to the forming of the second pillar forming material layer on the second sacrificial gap filling material and the first microfluidic channel separating material layer, a second hard mask material layer is formed on the second pillar forming material layer.

10. The method of claim 9, wherein the first array of first pillars contains a first hard mask material located thereon.

\* \* \* \* \*